United States Patent
Tanzawa et al.

[11] Patent Number: 5,933,436
[45] Date of Patent: Aug. 3, 1999

[54] ERROR CORRECTION/DETECTION CIRCUIT AND SEMICONDUCTOR MEMORY DEVICE USING THE SAME

[75] Inventors: Toru Tanzawa, Ebina; Tomoharu Tanaka, Yokohama; Riichiro Shirota, Fujisawa; Kazunori Ohuchi, Yokohama, all of Japan

[73] Assignee: Kabushiki Kaisha Toshiba, Kawasaki, Japan

[21] Appl. No.: 08/611,818

[22] Filed: Mar. 6, 1996

[30] Foreign Application Priority Data

Mar. 16, 1995 [JP] Japan ................................. 7-083459

[51] Int. Cl.$^6$ ................................. G11C 29/00
[52] U.S. Cl. .............. 371/39.1; 365/200; 371/40.17; 371/40.18
[58] Field of Search ................. 371/37.1, 40.1, 371/38.1, 39.1, 40.11, 40.18, 40.17; 365/200

[56] References Cited

U.S. PATENT DOCUMENTS

| | | | |
|---|---|---|---|
| 5,134,616 | 7/1992 | Barth, Jr. et al. | 371/10.3 |
| 5,226,043 | 7/1993 | Pughe, Jr. et al. | 371/40.1 |
| 5,307,356 | 4/1994 | Fifield | 371/40.1 |
| 5,313,464 | 5/1994 | Reiff | 371/2.1 |
| 5,438,577 | 8/1995 | Nakase et al. | 371/37.1 |
| 5,604,703 | 2/1997 | Nagashima | 365/200 |

FOREIGN PATENT DOCUMENTS

1-119997  5/1989  Japan .
4-163966  6/1992  Japan .

OTHER PUBLICATIONS

Kiyohiro Furutani, et al. A Built–in Hamming Code ECC Circuit for Dram's, IEEE Journal of Solid–State Circuits, vol. 24, No. 1, Feb. 1989, pp. 50–55.

Toshio Yamada, et al. "A 4–MBIT DRAM with 16–Bit Concurrent ECC", IEEE Journal of Solid–State Circuits, vol. 23, No. 1, Feb. 1988, pp. 20–25.

W.W. Peterson, et al. Error Correcting Codes, 2nd Edition, MIT Press, 1972, pp. 230–243.

*Primary Examiner*—Stephen M. Baker
*Attorney, Agent, or Firm*—Oblon, Spivak, McClelland, Maier & Neustadt, P.C.

[57] ABSTRACT

An error correction/detection circuit including a syndrome generating circuit for generating a syndrome from information data and check data input in a first cycle; and an error position/size calculating circuit for calculating a position and a size of an error from said syndrome; and an error correction circuit for correcting an error for at least information data input in a second cycle on a basis of the position and the size of the error obtained in said error position/size calculating circuit and for outputting at least error-corrected information data.

31 Claims, 18 Drawing Sheets

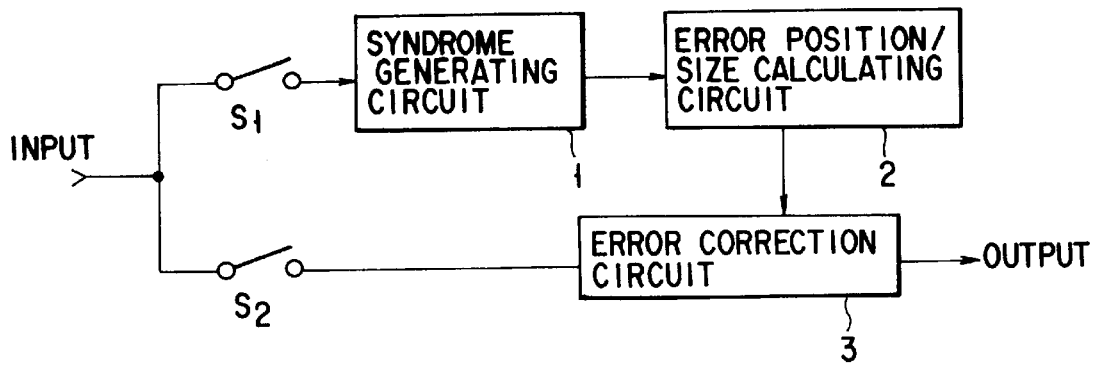
F I G. 5
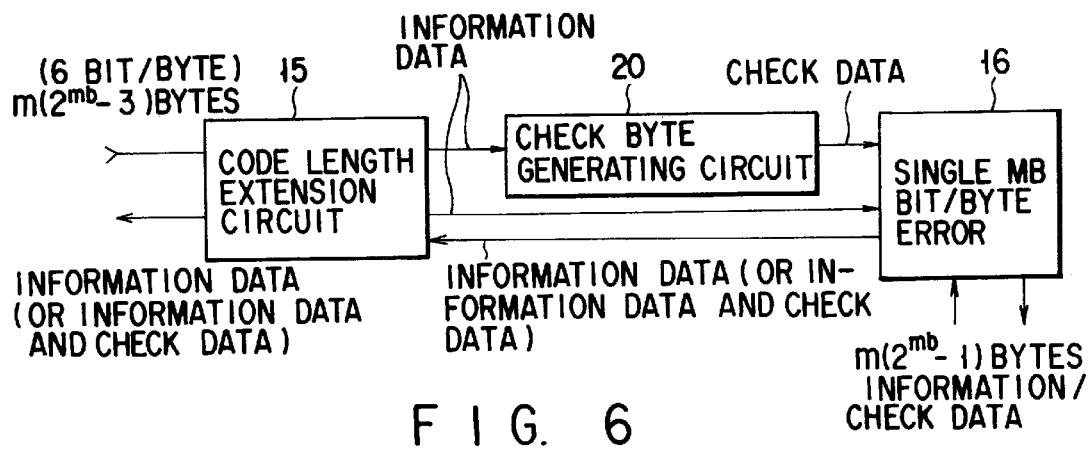
F I G. 6
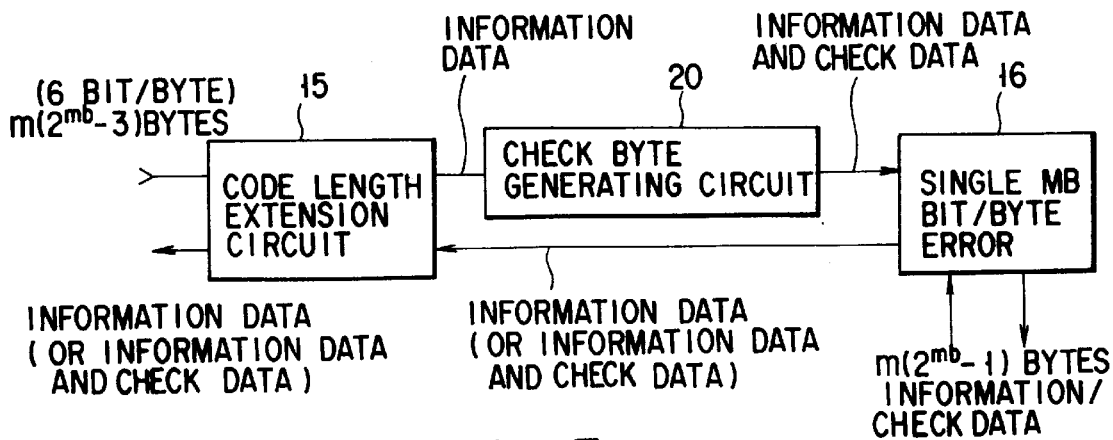
F I G. 7

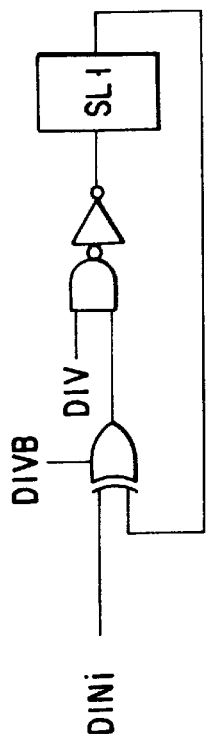
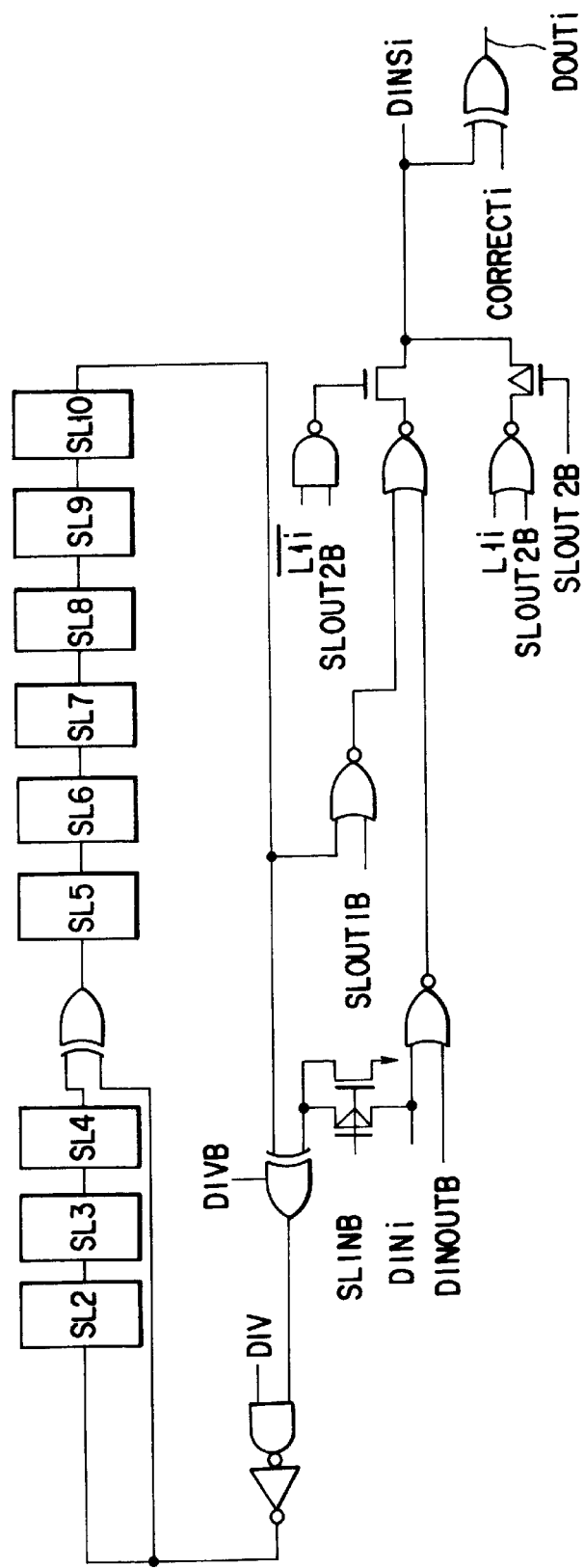
FIG. 10A
FIG. 10B

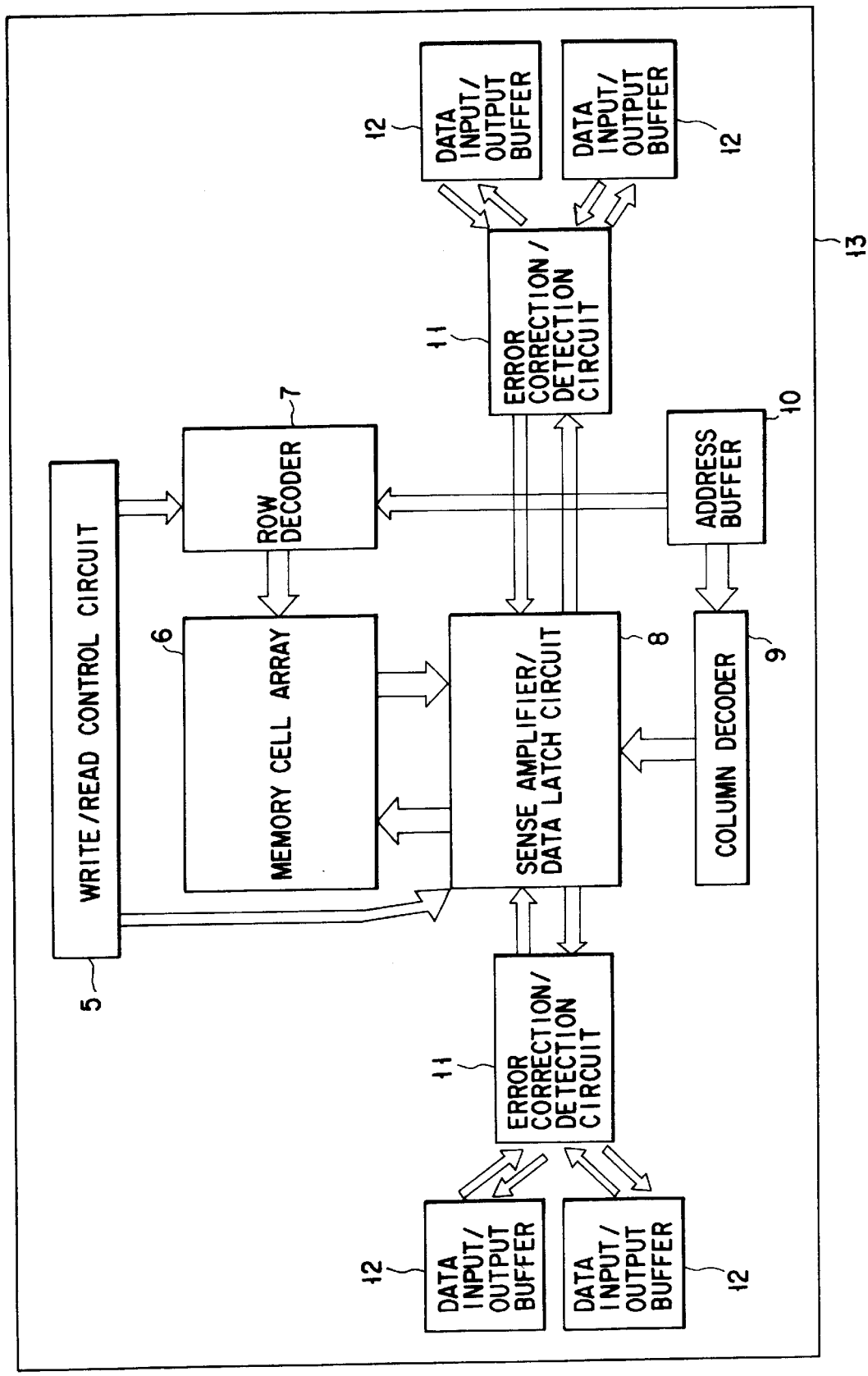
F I G. 15

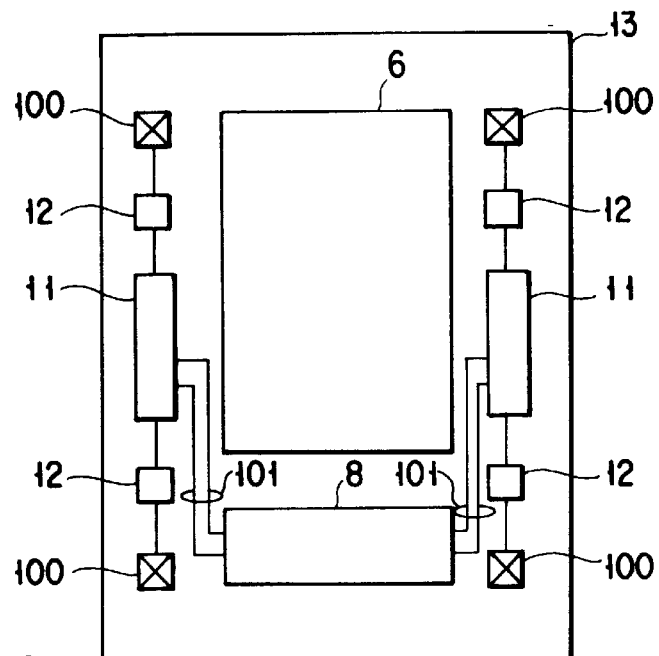
FIG. 16
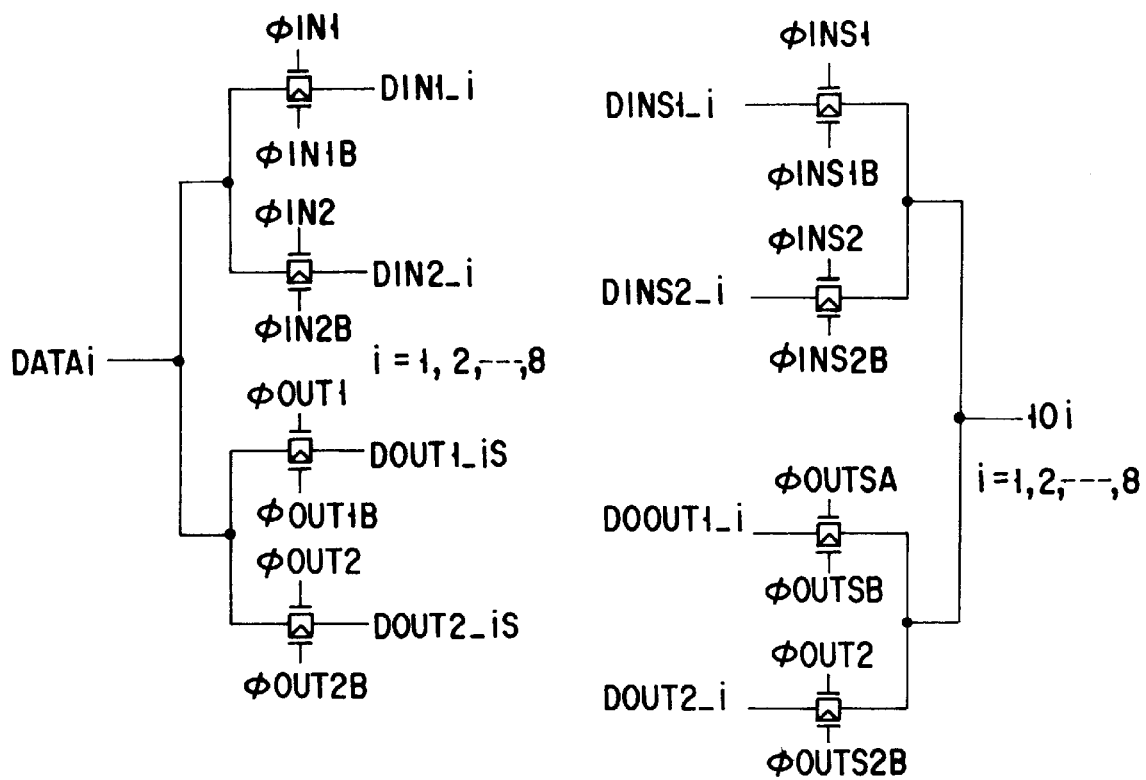
FIG. 17A
FIG. 17B

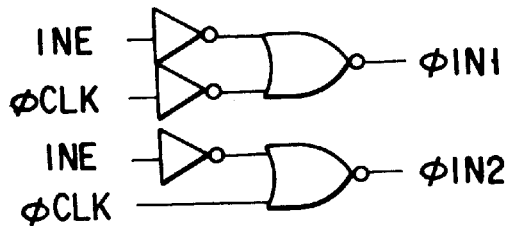
FIG. 18K
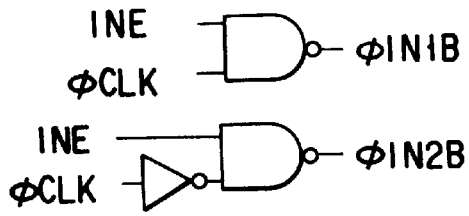
FIG. 18O
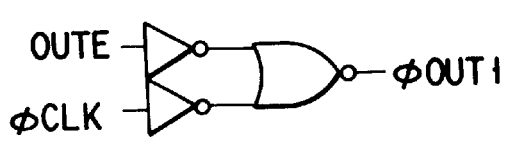
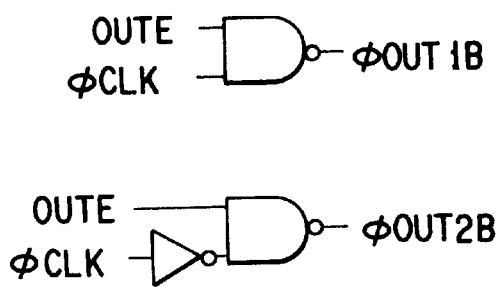
FIG. 18L
FIG. 18P
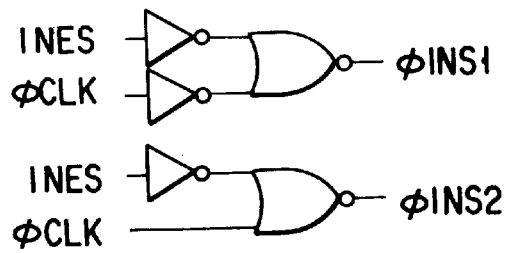
FIG. 18M
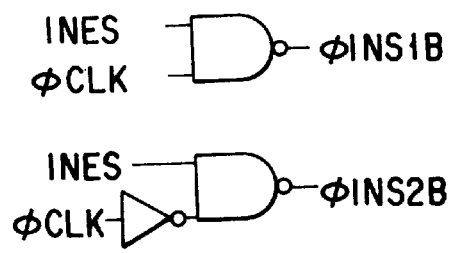
FIG. 18Q
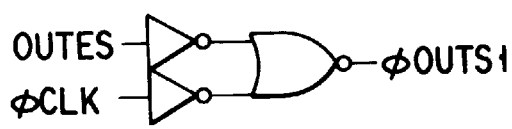
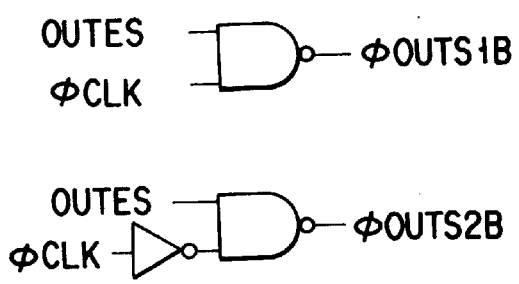
FIG. 18N
FIG. 18R

ERROR CORRECTION/DETECTION CIRCUIT AND SEMICONDUCTOR MEMORY DEVICE USING THE SAME

BACKGROUND OF THE INVENTION

1. Field of the Invention

This invention relates to an error correction/detection circuit for correcting/detecting bit errors with respect to bit data, and to a semiconductor memory device in which the error correction/detection circuit is used.

2. Description of the Related Art

Two methods, i.e., parallel processing scheme (IEEE Journal of Solid-State Circuit, vol. 24, pp 50, 1989) and serial processing scheme ("Error-Correcting Codes" authored by Peterson and Weldon, second edition) are known as error correction/detection methods. FIGS. 1A and 1B illustrate constitutional examples of a 1 bit error correction code with respect to data of 512 bit depth×8 bit width in parallel processing scheme and serial processing schemes, respectively.

In a conventional semiconductor memory device, since an error correction processing time has been considered to be the highest priority, parallel processing scheme (FIG. 1A) which exhibits less generation of check bits in case of writing operation as well as less time loss for correcting errors in case of reading operation at the time of inputting/outputting data has been utilized. In this case, 4 bits of check bit are required for 8 bit data. In other words, its memory region increases by 50%. On the other hand, in case of serial processing scheme (FIG. 1B), 10 bits of check bit are sufficient for 512 bit data, and the redundancy thereof is about 2%. However, a delay time of 522 bit length is required for correcting errors.

Serial processing scheme is more suitable than parallel processing scheme, provided that the reliability of a memory in case of adding no error correcting code is inferior to that to be required, and the reliability of a memory in case of adding a code for correcting 1 bit error in 512 bit data is better than that to be required, besides a rate of increase in a memory region is made more preferential than a processing time for error correction.

In a size of error correction circuit, however, there is a case where serial processing scheme becomes conversely larger than parallel processing scheme. The reason why there is the above case is as follows. In case of serial processing scheme, the error correction circuit comprises principally a delay circuit composed of shift registers equal to the depth of data including a check data section (522 bits×8 sets in the above example) and a syndrome generating circuit composed of shift registers the number of which is equal to the check bit number (10 bits×8 sets in the above example), while in parallel processing scheme, the error correction circuit comprises only 4 sets of 5 input exclusive ORs and their output logics.

As is understood from the above description, while serial processing scheme can reduce extremely a rate of increase in the memory region as compared with that of parallel processing scheme, the size of an error correction circuit becomes conversely larger, so that an effect for suppressing a rate of increase in memory chips is small.

Furthermore, in parallel processing scheme, since it is required to effect processing in accordance with 8 bit parallel manner, the error correction circuit must be disposed either between a memory cell and a bit line control circuit or in a place where all of IO lines are gathered, so that flexibility in the arrangement is poor from a layout point of view.

Constitutions and problems of conventional error correction/detection circuits will be specifically described hereinbelow.

FIG. 2 is a block diagram showing the error correction/detection circuit according to a first conventional example which is disclosed in the above-mentioned literature ("Error-Correcting Codes" authored by Peterson and Weldon, Second Edition).

Input data is input to a syndrome generating circuit (check bit generation circuit) 1 and a delay circuit 4. The syndrome has a certain value, i.e., zero in the case where the input data contain no error, while a number other than zero in the case where the input data contain an error, and the resulting value is input to an error position/size calculating circuit 2 which calculates the position and the size of an error.

In the case where the input syndrome is zero, the error position/size calculating circuit 2 outputs zero, and the data input to the delay circuit 4 are output through the error correction circuit 3 as they are without any modification. When the syndrome has a certain value being the one other than zero, the error position/size calculating circuit 2 calculates the position and the size of the error, and the error involved in the data input to the delay circuit 4 is corrected in the error correction circuit 3, thereafter the data corrected are output therefrom. More specifically, correction of errors is made by the error correction circuit 3 in only the case where there is outputting data involving any error, and as a result correct data are output.

In this type of constitution, however, the delay circuit 4 is composed of shift registers each having the same length as that of input data, so that a ratio of the delay circuit 4 occupying the whole error correction circuit becomes high in case of particularly a long code length. This results in a cause for increasing the size of an error correction circuit.

In the following, a second conventional example relating to a so-called 1 byte error correction code wherein 1 byte error is corrected among information data of $(2^b-3)$ bytes in which 1 byte is composed of b bits will be described. In a single byte error correction circuit, check data of 2 bytes are prepared from input information data (coding), and an error of 1 byte is corrected from information data and check data (decoding), so that correct information data are output.

In the meantime, the maximum data length is limited to $(2^b-3)$ due to magnitude b of 1 byte, so that when longer information data than $(2^b-3)$ bytes are intended to be handled, the information data must be divided into blocks each having a length of $(2^b-3)$ or less. In the case where information data are successively input to an error correction circuit, it is required to prepare a single byte error correction circuit with respect to each of the blocks. For this reason, the size of such error correction circuit becomes large. This case is the same as a plural byte error check circuit.

Furthermore, in the case where there is only a single error correction circuit, information is coded/decoded in every block of information data, so that the information data cannot be successively input to or output from the error correction circuit.

FIG. 3 is a block diagram showing a semiconductor memory device provided with the error correction/detection circuit relating to a third conventional example. The semiconductor memory device 13 comprises a memory cell array 6 in which electrically rewritable memory cells are arranged in matrix-shaped, a sense amplifier/data latch circuit 8 which latches data in memory cells in the memory cell array or rewritten data, a plurality of data input/output buffers 12 which input rewritten data from the outside and output data read from the memory cells, an error correction/detection circuit 11 which generates check data for correcting and detecting an error from the rewritten data input as well as which corrects and detects an error in read data from the read data and check data in case of outputting the read data, an address buffer 10 to which are input addresses of the memory cells and from which are output column addresses and row addresses, a column decoder 9 which decodes column addresses and controls inputting/outputting of data from the sense amplifier/data latch circuit 8, a row decoder 7 which decodes row addresses, and a writing/reading control circuit 5 which outputs control signals for writing and reading data in the memory cells.

The semiconductor memory device 13 as described above is disclosed in the above-mentioned literature (IEEE Journal of Solid-State Circuits, vol. 24, pp 50, 1989). In the present conventional example, for the sake of minimizing a processing time for coding/decoding data, error correction codes are processed parallely. The code consists of information data of 1 bit or plural bits in every data input/output lines and check data obtained from the information data, since to the code is applicable parallel processing.

In every case where the bit number of information data doubles, the bit number of check data requires about 1 more bit, so that a ratio of the bit number of check data to that of information data decreases with increase of the bit number of information data. On the other hand, the number of an exclusive OR for coding/decoding is roughly proportional to the bit number of information data, so that the size of a coding/decoding circuit becomes large with increase of the bit number of information data. Accordingly, there is the minimum value of a sum of an area of redundant memory cells and an area of a coding/decoding circuit for effecting error correction/detection, and further there is an optimum value of the bit number in information data which brings about the aforesaid minimum value.

On one hand, in error correction/detection circuits, such a type of circuit is realized by shift register series instead of the above described type of circuit which is realized by exclusive OR. In the former case, it is required to prepare a delay circuit which is realized by shift register series the number of which is equal to the bit number of check data and shift register series the number of which is equal to the sum of the bit number of information data and the bit number of check data. Therefore, the number of shift registers increases about 2 bits in every case where the bit number of information data becomes twice. For this reason, although the size of a coding/decoding circuit per unit information data reduces with increase of the bit number of information data, a ratio of delay circuits occupying the whole of an error correction circuit becomes high, and this brings about an increase in the size of an error correction circuit. Moreover, when this type of an error correction/detection circuit is used, a delay time being proportional to the sum of the bit number of information data and the bit number of check data is required for decoding.

Furthermore, a layout of the memory cell array 6, the respective circuits 8, 11, 12, input/output pads 100 and the like in the present conventional example is shown in FIG. 4. As is seen from the figure, the error correction/detection circuit 11 is required to be disposed between the memory cell array 6 and the sense amplifier/data latch circuit 8, or in a place where the whole I/O lines are collected, so that there is no flexibility from a layout point of view.

There is such a case even when burst error occurs, the data become code words, so that the burst error cannot be detected. More specifically, when a burst error occurs, all of the "1" in the data turn into "0", so that the whole "0" data composed of all the "0" values is judged in such a way that there is no error because the whole "0" data is one of the code words. Thus, the occurrence of burst error cannot be detected in this case.

As described above, in a conventional error correction/detection circuit of serial processing scheme, a ratio of the delay circuit occupying the whole error correcting circuit becomes high in case of a long code length, and this results in an increase in the size of the error correction circuit.

Furthermore, when there is only a single byte error correction circuit, information data cannot be input/output successively. Accordingly, when information data are successively input to the error correction circuit, single byte error correction circuits become required for each of blocks, so that the size of the error correction circuit comes large.

Moreover, in an error correction circuit of the type which is realized by shift register series, a ratio of the delay circuit occupying the whole error correction circuit becomes high in case of particularly long code length, and this brings about an increase in the size of the error correction circuit.

Still further, an error correction/detection circuit is required to be disposed either between the memory cell array and the data circuit, or in a place where the whole IO lines are gathered, so that this creates a problem that there is reduced flexibility from a layout point of view.

SUMMARY OF THE INVENTION

An object of the present invention is to provide an improved error correction/detection circuit and a semiconductor memory device in which the error correction/detection circuit is used. The above effects of the invention may be further clarified as follows:

(1) To provide an error correction/detection circuit in which a delay circuit having a high ratio occupying the size of the circuit can be omitted, so that the circuit size can be extremely reduced.

(2) To provide an error correction/detection circuit the size of which can be reduced even in the case where information data are successively input to and output from the error correction/detection circuit.

(3) To provide a semiconductor memory device by which burst error at the time of rewriting data can be detected.

(4) To provide a semiconductor device by which flexibility in the layout of an error correction/detection circuit can be increased.

In order to attain the above described objects, the present invention involves the following constitutions.

According to the first aspect of the present invention, the error correction/detection circuit comprises a syndrome generating circuit for generating syndrome from the information data and the check data which were input in a first cycle; an error position/size calculating circuit for calculating the position and the size of an error from the syndrome; and an error correction circuit for outputting at least the information data in which the error has been at least corrected for at least the information data which were input in a second cycle on the basis of the position and the size of the error obtained in the error position/size calculating circuit. The error correction/detection circuit further comprises a first switch which is connected to the input side of the syndrome generating circuit and which is turned ON in the first cycle, while it is turned OFF in the second cycle; and a second switch which is connected to the input side of the error correction circuit and which is turned OFF in the first cycle, while it is turned ON in the second cycle.

In the first aspect, another semiconductor memory device comprises a memory cell array wherein memory cells are disposed in matrix-shaped; a sense amplifier/data latch circuit for sensing and latching data of the memory cells during read operation; and an error correction/detection circuit according to the first aspect, wherein the sense amplifier/data latch circuit sends a latched data to the error correction/detection circuit twice.

In accordance with the first aspect of the present invention, since the same data are input twice, a delay circuit having a high ratio occupying the circuit size of the error correction circuit can be omitted. For this reason, not only the circuit size of the error correction circuit can extremely be reduced, but also decoding for error correction/detection can be carried out without delay as compared with a conventional case.

According to the second aspect of the present invention, the error correction/detection circuit for inputting/outputting successively information data from ROM and the like comprises a code length extension circuit for converting information data wherein 1 byte is b bits into information data wherein 1 byte is mb bits (m is a natural number being 2 or more); a check data generating circuit for generating check data for correcting single byte error or plural bytes error composed of mb bits from the output of the code length extension circuit; and single byte error or plural bytes error correction circuit for correcting single byte error or plural bytes error composed of mb bits on the basis of the information data and the check data. The byte error correction circuit outputs successively information of b bits bytes after correcting single byte error or plural bytes error composed of mb bits.

In accordance with the second aspect of the present invention, in the single byte error detection code, since the bit number which composes 1 byte is modified from a unit which is input/output parallely into plural units, it becomes possible to lengthen code length. Accordingly, it becomes not required to divide information data into blocks in even the case of long information data, so that the size of the error correction circuit can be reduced.

According to the third aspect of the present invention, the error correction/detection circuit comprises a plurality of error detection circuits for detecting errors of data which are made into blocks; and means for outputting a burst error detection signal in the case when errors were detected in all the error detection circuits.

Furthermore, the first semiconductor memory device according to the present invention comprises a memory cell array wherein memory cells are disposed in matrix-shaped; N data output buffers for outputting data with respect to the memory cells; and n error correction/detection circuits which are provided corresponding to n ($1 \leq n \leq N$) of the data output buffers and which corrects/detects errors of read data. In the first semiconductor memory device, the aforesaid error correction/detection circuits are disposed in every the data output buffers or in every the plural data output buffers disposed nearby one another. Furthermore, in the first semiconductor memory device, the aforesaid error correction/detection circuit is disposed in the vicinity of the aforesaid data output buffers.

The second semiconductor memory device according to the present invention comprises a memory cell array wherein electrically rewritable memory cells are disposed in matrix-shaped; N data input/output buffers for inputting rewritable data to the memory cell array from the outside as well as for outputting read data from the memory cells; and an error correction/detection circuit which is provided to n ($1 \leq n \leq N$) of the data input/output buffers, produces check data for correcting/detecting an error from the rewritten input data, and corrects/detects an error in the read data by the read data and the check data in case of outputting the read data. Furthermore, in the second semiconductor memory device, the aforesaid error correction/detection circuits are disposed in the vicinity of the data output buffers. Moreover, in the second semiconductor memory device, the aforesaid error correction/detection circuit conducts operation for error correction/detection at a position where burst error can be detected in case of rewriting data.

The preferred embodiments of the present invention may be enumerated as follows.

(1) To apply the error correction/detection circuit according to the first aspect of the present invention to the first semiconductor memory device.

(2) To apply the error correction/detection circuit according to the second aspect of the present invention to the second semiconductor memory device.

(3) To apply the error correction/detection circuit according to the third aspect of the present invention to the first or the second semiconductor memory device.

According to the semiconductor memory device of the present invention, when error correction circuits are disposed in the vicinity of (input and/or)output buffers in every respective data (input and/or)output buffers or in every plural data (input and/or)output buffers, flexibility in the layout of the device can be increased. Furthermore, when coding/decoding is carried out at a position where burst error can be detected, the occurrence of burst error at the time of rewriting data can be detected.

As described above, in accordance with the error correction/detection circuit, when the same data are input twice, a delay circuit which has a high ratio occupying the circuit size of the error correction circuit can be omitted, so that not only the circuit size of the error correction circuit can be extremely reduced, but also decoding for error correction/detection can be carried out without delay as compared with a conventional case.

Moreover, in a single byte error detection code, when the bit number which composes 1 byte is modified from a unit which is input/output parallely into plural units, it becomes possible to lengthen code length.

Furthermore, when coding/decoding is carried out at a position where burst error can be detected, the occurrence of burst error at the time of rewriting data can be detected. Besides, when error correction circuits are disposed in the vicinity of (input and/or)output buffers for every respective data (input and/or)output buffer or for respective sets of plural data (input and/or)output buffers, flexibility in the layout of the device can be increased.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 is a block diagram showing the error correction/detection circuit in serial processing scheme according to the first embodiment of the present invention;

FIG. 6 is a block diagram showing the error correction/detection circuit in serial processing scheme according to the second embodiment of the present invention;

FIG. 7 is a block diagram showing the semiconductor memory device according to the second embodiment of the present invention;

FIGS. 10A and 10B are views showing the coding/decoding circuit in the device according to the third embodiment of the present invention, respectively;

FIG. 15 is a block diagram showing the semiconductor memory device according to the fourth embodiment of the present invention;

FIG. 16 is a layout diagram showing memory cell arrays, respective circuits, input/output pads and the like in the fourth embodiment of the present invention;

FIGS. 17A and 17B are diagrams each showing the specific circuit structure of an error correction circuit;

DETAILED DESCRIPTION OF THE PREFERRED EMBODIMENTS

Embodiments of the present invention will be described in detail hereinbelow in conjunction with the accompanying drawings.

(Embodiment 1)

Figure 1A:
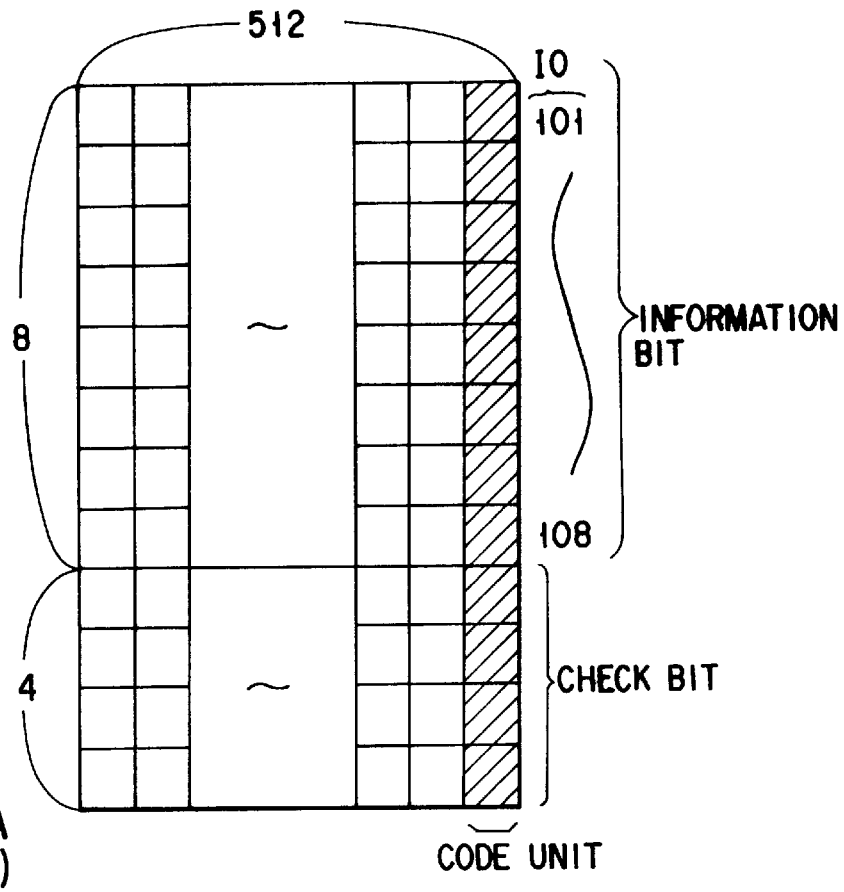
FIGS. 1A and 1B are views illustrating constitutional examples of a 1 bit error correction code in parallel processing scheme and serial processing schemes, respectively.
Figure 1B:
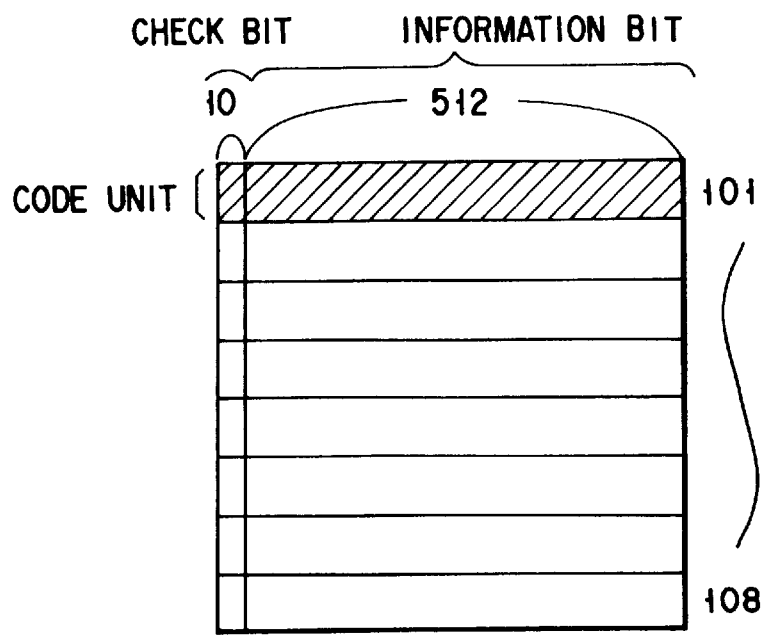
Figure 2:
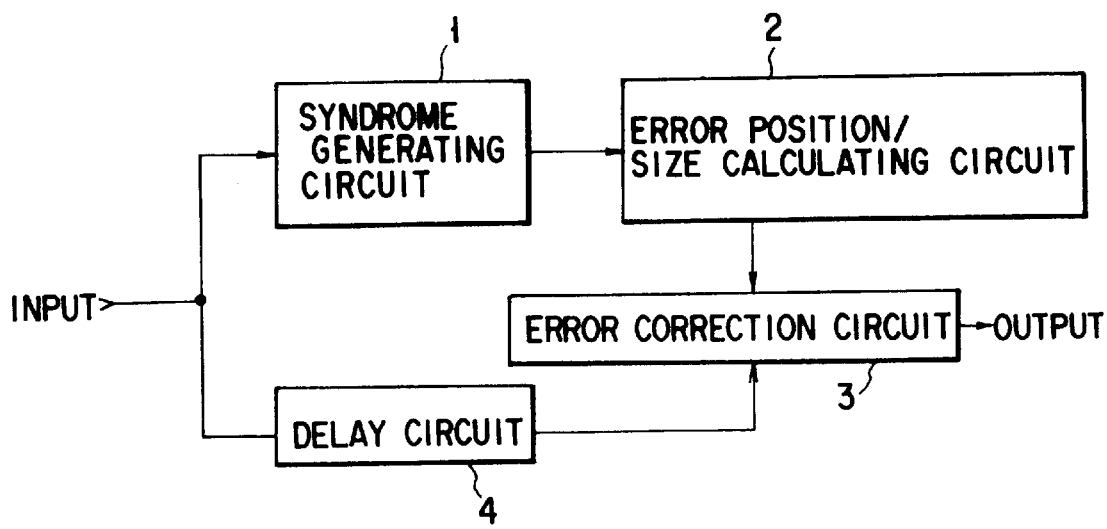
FIG. 2 is a block diagram showing the error correction/detection circuit according to a first conventional example.
Figure 4:
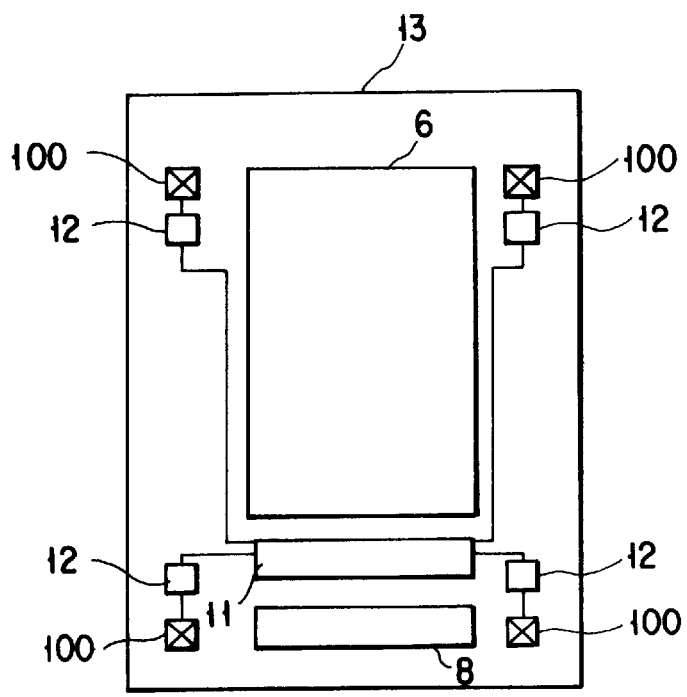
FIG. 4 is a diagram showing a layout of memory cell arrays, respective circuits, input/output pads and the like in the third conventional example.
Figure 3:
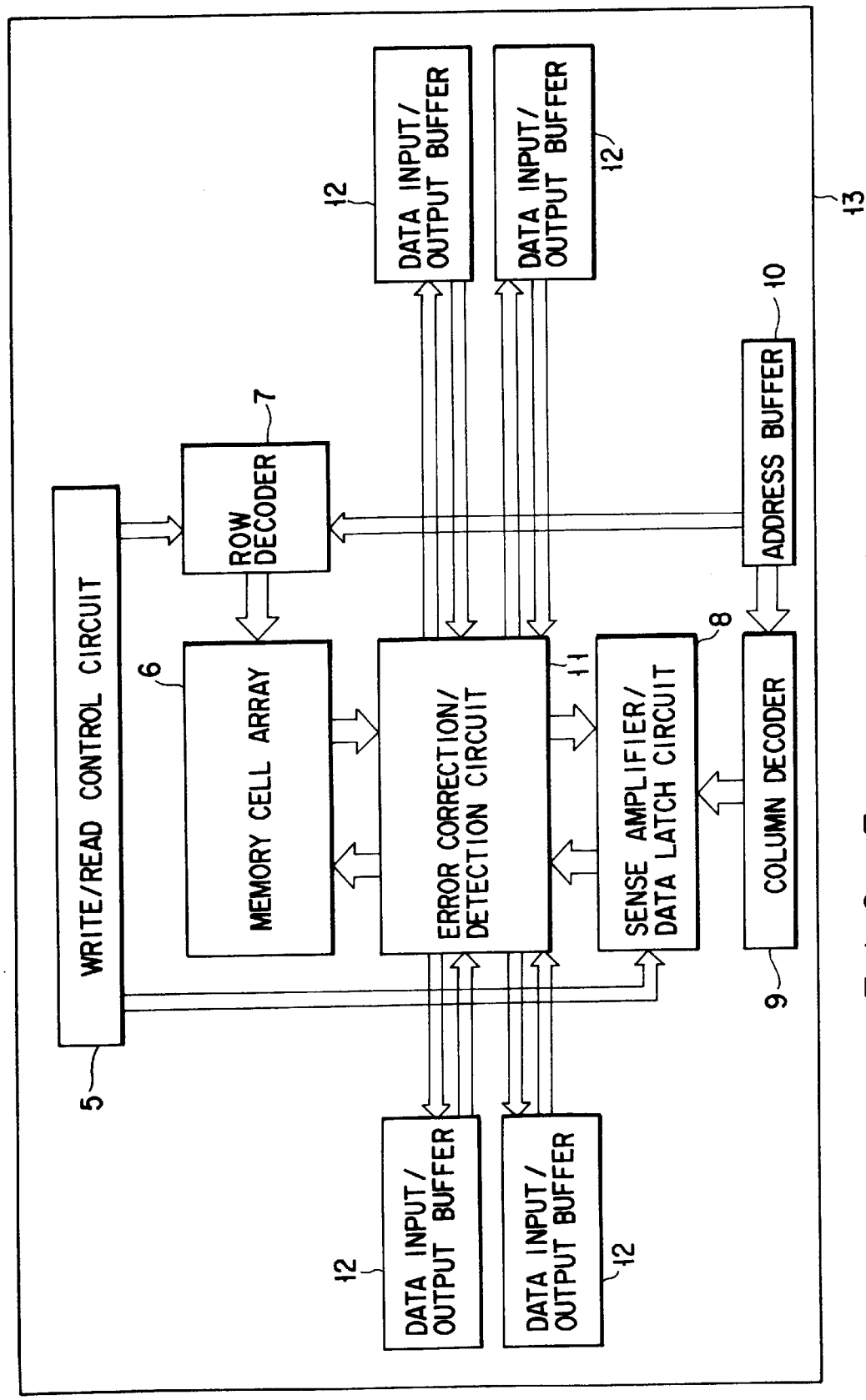
FIG. 3 is a block diagram showing a semiconductor memory device provided with the error correction/detection circuit according to a third conventional example.

FIG. 5 is a block diagram showing the error correction/detection circuit in serial processing scheme according to the first embodiment of the present invention wherein the basic constitution is the same as that of the circuit shown in FIG. 2, but in the present embodiment, the delay circuit is omitted and switches S1 and S2 are provided on the input side in place of the delay circuit, besides input data are input twice.

At the first time of inputting data, the switch S1 is in ON state, while the switch S2 is in OFF state, respectively. After the completion of inputting data at the first time, syndrome calculation is simultaneously finished by means of a syndrome generating circuit 1, and execution of the calculation for the position and the size as to an error is started by means of an error position/size calculating circuit 2. At the second time of inputting data, the switch S2 turns ON and the switch 1 turns OFF, thereby the data are input to the error correction circuit 3.

As described above, since a delay circuit is omitted in the present invention, the circuit size of the error correction circuit can be reduced as compared with a conventional case, and particularly in case of a long code length, the circuit size of the error correction circuit can remarkably be reduced, besides correct data are output without increasing a delay time. Furthermore, there is no need of adding another circuit for repeating inputting of data twice in the case where a memory which is used as the inputting object is the one containing data latch circuits the number of which is equal to the code length as in a NAND type EEPROM.

(Embodiment 2)

FIG. 6 is a block diagram showing the error correction/detection circuit in serial processing scheme according to the second embodiment of the present invention wherein a code length extension circuit 15 outputs the number m of b bit/bytes input successively in the form of one mb bit/byte. The resulting output is input to a check byte generating circuit 20 and a single mb bit/byte error correction circuit 16. In the check byte generating circuit 20, check data are generated on the basis of the data input from the code length extension circuit 15 to output the check data to the single mb bit/byte error correction circuit 16. The error correction circuit 16 corrects single mb bit/byte error on the basis of the input data.

In this case, not only the maximum data length may be made to be $m \times (2^{mb}-3)$ byte (1 byte=b bits), but also necessary check data can be reduced to 2m bytes (1 byte=b bits).

Heretofore, in the case where the maximum data length is intended to be $m \times (2^{mb}-3)$ bytes (1 byte=b bits), when information data are successively input to an error correction circuit, $m \times (2^{mb}-3)/(2^b-3)$ of the single byte error correction circuits 14 and $2m \times (2^{mb}-3)/(2^b-3)$ of check data are required. These numerals are arranged in the following Table 1.

TABLE 1

| Code | Number to be Used(Set) | Information Bit Number | Check Bit Number |
| --- | --- | --- | --- |
| SbEc | 1 | $b \times (2^b - 3)$ | $2b$ |
|  | $m \times \dfrac{(2^{mb} - 3)}{(2^b - 3)}$ | $mb \times (2^{mb} - 3)$ | $2mb \times \dfrac{(2^{mb} - 3)}{(2^b - 3)}$ |
| SmbEC | 1 | $mb \times (2^{mb} - 3)$ | $2mb$ |

FIG. 7 is a diagram showing a modified example of FIG. 6.

It is arranged in FIG. 6 in such that the code length extension circuit 15 outputs information data to the error correction circuit 16 and the check byte generating circuit 20, while the check byte generating circuit 20 outputs only check data. In FIG. 7, however, the information data from the code length extension circuit 15 are output together with the check data generated in the check byte generating circuit 20 to the error correction circuit 16 through the check byte generating circuit 20.

In cases of FIGS. 6 and 7, the data output from the error correction circuit 16 to the code length extension circuit 15 may be either information data only or data containing information data and check data.

(Embodiment 3)

Figure 8:
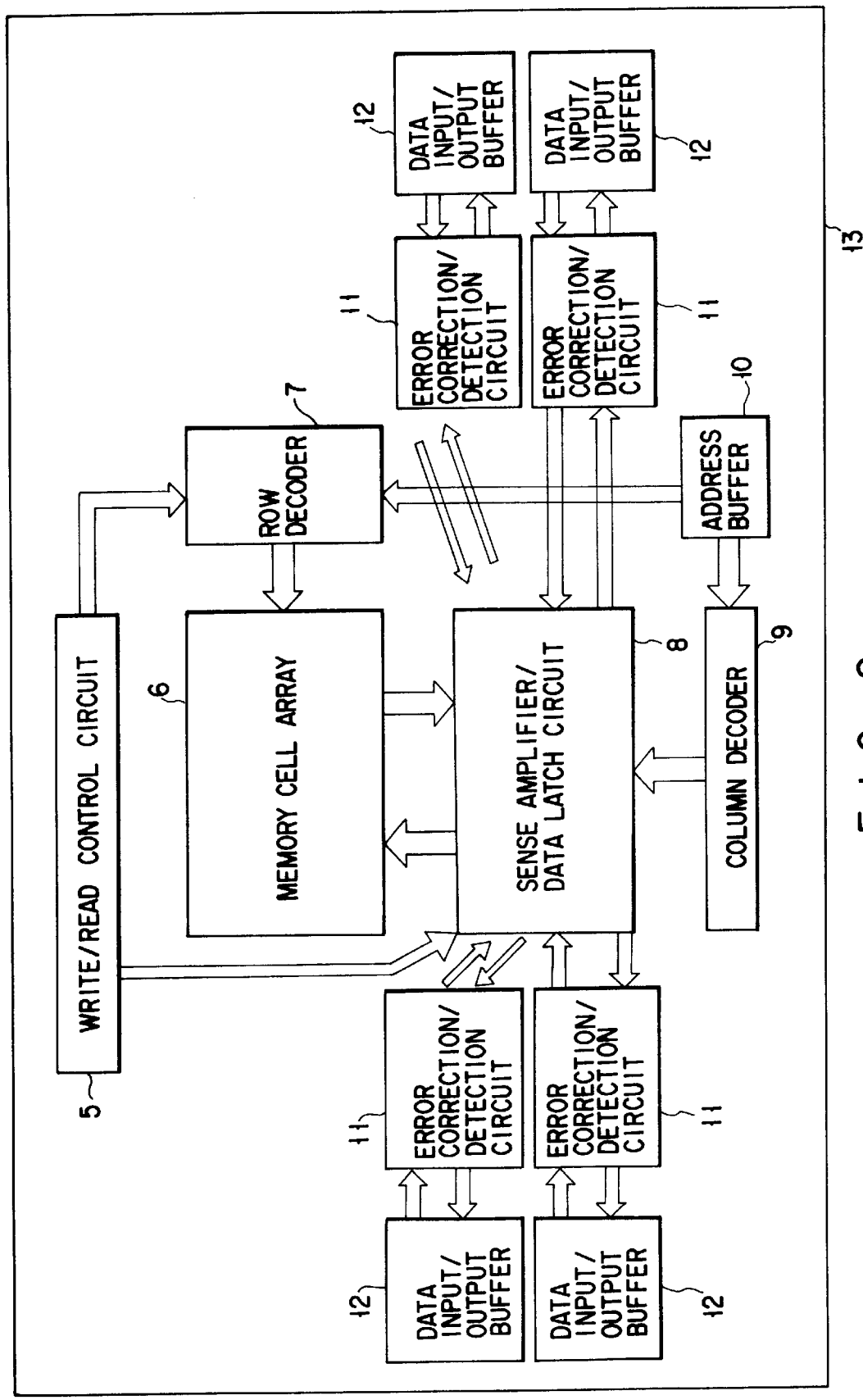
FIG. 8 is a block diagram showing the semiconductor memory device according to the third embodiment of the present invention.
Figure 9:
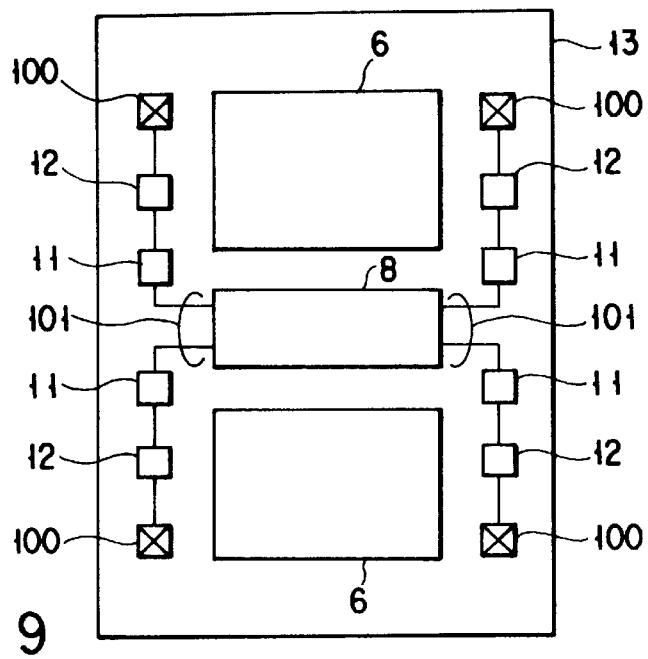
FIG. 9 is a layout diagram showing the semiconductor memory device of FIG. 8.
Figure 11A:
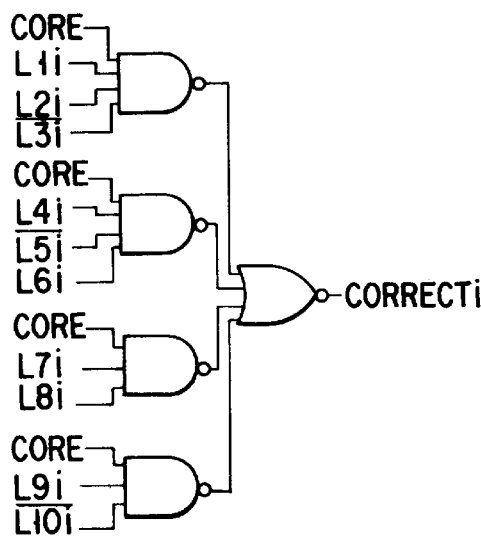
FIGS. 11A through 11E are views showing the coding/decoding circuit in the device according to the third embodiment of the present invention, respectively.
Figure 11B:
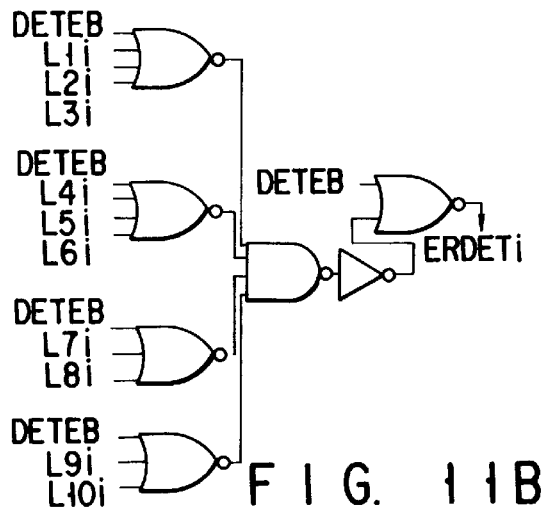
Figure 11C:
Figure 11D:
Figure 11E:
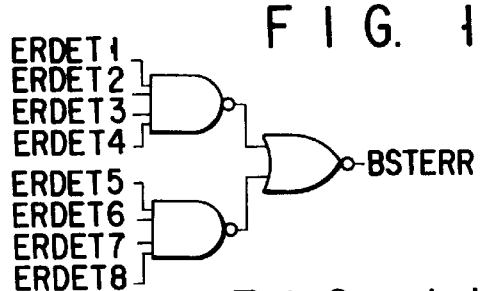
Figure 12A:
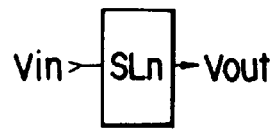
FIGS. 12A through 12D are diagrams showing the coding/decoding circuit in the device according to the third embodiment of the present invention, respectively.
Figure 12B:
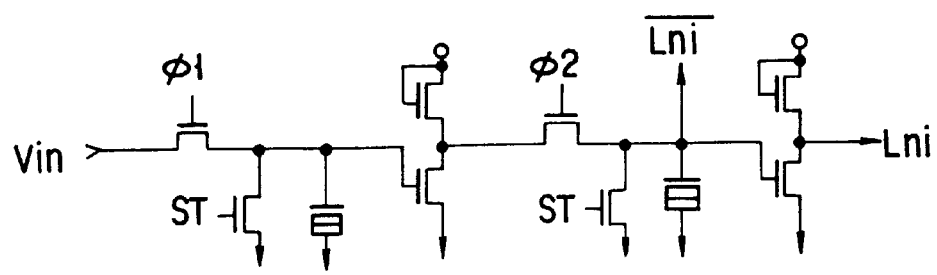
Figure 12C:
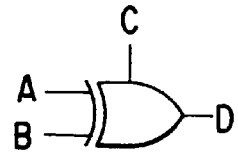
Figure 12D:
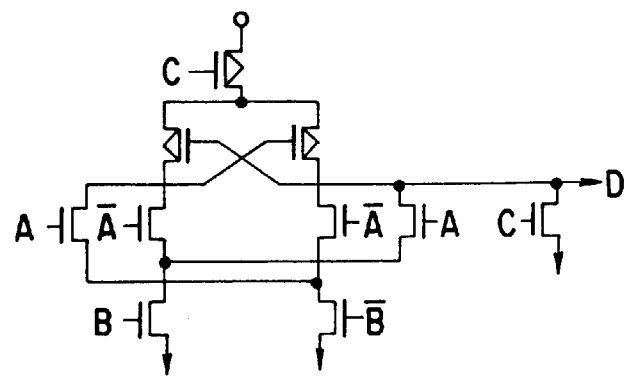

FIG. 8 is a block diagram showing the semiconductor memory device according to the third embodiment of the present invention, while FIG. 9 is a layout diagram showing the semiconductor memory device of FIG. 8.

As is understood from the comparison with FIG. 6, in the present embodiment, an error correction circuit 11 is not disposed between a memory cell array 6 and a sense amplifier/data latch circuit 8, but an error correction/detection circuit 11 is provided for every data input/output buffer 12. The error correction/detection circuit 11 produces the check data for correcting or detecting an error from the input rewrite data, and corrects or detects an error in read-out data from the read-out data and checks data in case of outputting the read-out data.

In the arrangement as described above, a temporary register has been required heretofore for correcting an error. In the present invention, however, such temporary register is not used, but the sense amplifier/data latch circuit 8 serves also as a register, so that no circuit area increases.

In the present embodiment, information data composed of 256 bytes (1 byte=8 bits) are serieally input/output through eight data input/output pads. In this case, extension Hamming codes (266, 256) which correct single bit error in 256 bits of information data and detects even number bits error are used.

Figure 13:
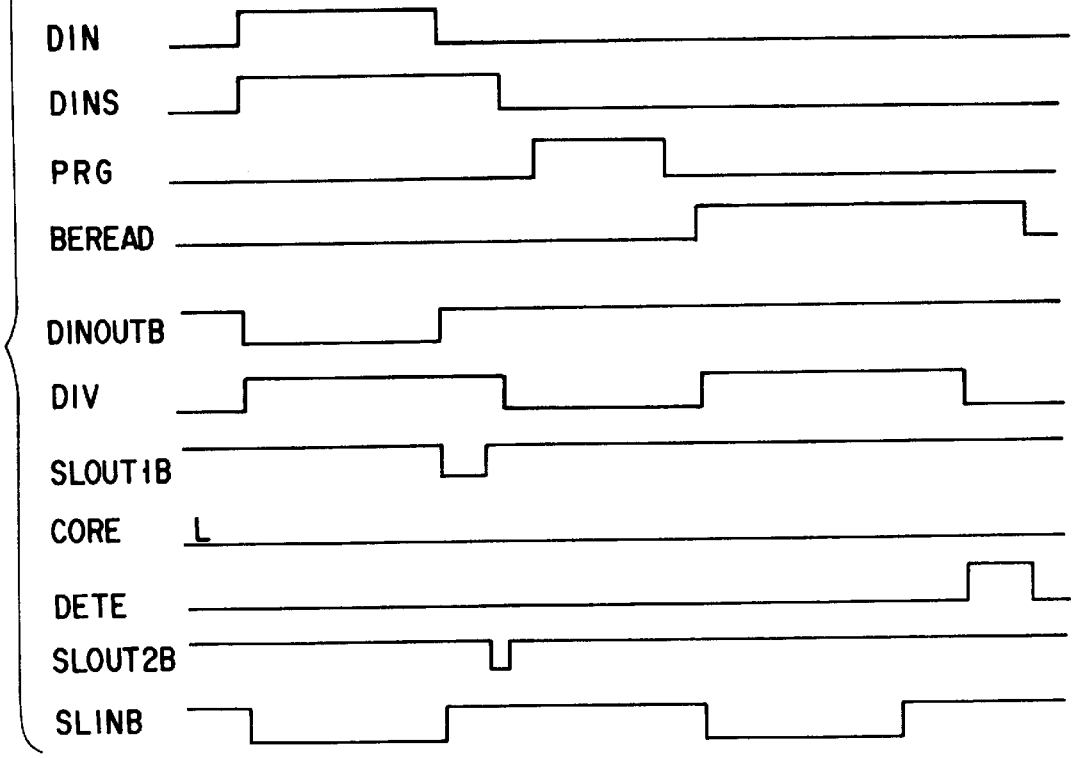
FIG. 13 is a diagram illustrating timing of control signals for writing operation in the device according to the third embodiment of the present invention.
Figure 14:
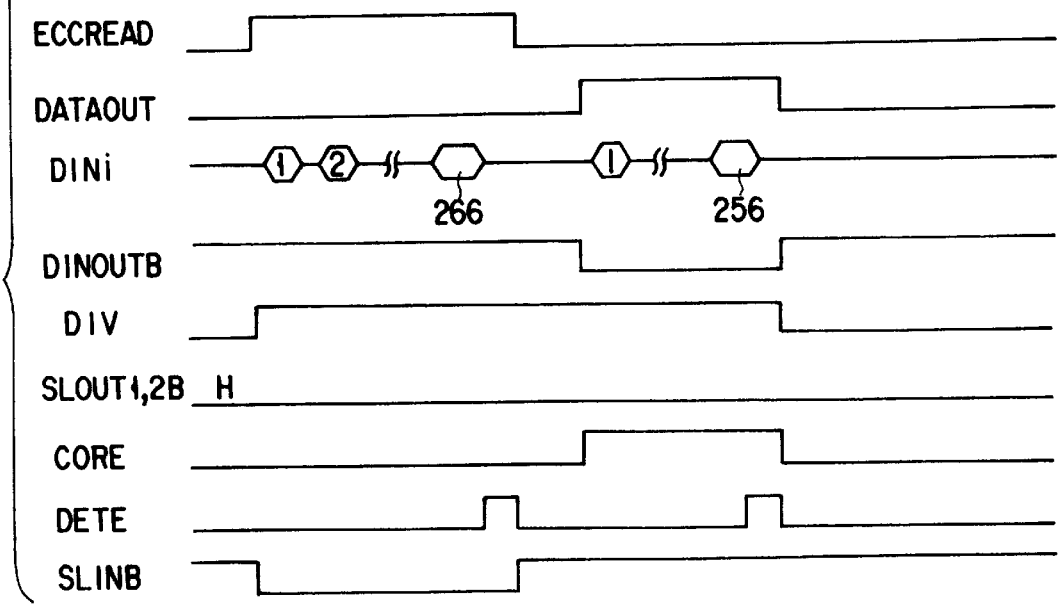
FIG. 14 is a view illustrating timing of control signals for reading operation in the device according to the third embodiment of the present invention.

FIGS. 10A through 12D, inclusive, show the coding/decoding circuits in the present embodiment, while FIGS. 13 and 14 show each timing of control signals in writing operation and reading operation.

At first, operation in case of writing data will be described hereinbelow.

During a period wherein a signal DIN is high, write information data DINi (i=1, . . . , 8) are input from data input/output pads, and input to the coding circuits shown in FIGS. 10A and 10B. In this case, a signal DINOUTB is set to be low, and DINSi=DINi is sent to the sense amplifier/data latch circuit 8. At the same time, since a signal SLINB is made to be low and a signal DIV is set to be high, the write information data DINi are input to a shift register SL1 and shift register series SL2, . . . , SL10, so that a calculation for generating check bits is carried out. A clock in the shift register is synchronized with that of the input data DINi. Since signals SLOUT1B and SLOUT2B are allowed to be high, output from the shift registers SL1 through 10 is not output to the DINSi.

When completed inputting of the write information data DINi, conditions are changed in such that the signal DINOUTB is high, the signal DIV is low, the signal SLINB is high, and the signal SLOUT1B is low, while the clock in the shift register SL1 stops. In this case, conditions of the shift register series SL2, . . . SL10 represent nine check bits, and when input is fixed in a low state, it is output to CINSi. Thereafter, the signal SLOUT1B is made to be high and the signal SLOUT2B is made to be low, so that the condition of the shift register SL1 being one check bit is output to the DINSi. When the signal DINS becomes low and the signal SLOUT2B becomes high, inputting to the sense amplifier/data latch circuit 8 is finished.

Thus, the write data to be input to the sense amplifier/data latch circuit 8 are composed of 256 bits information data and 10 bits check data.

Then, write data 2128 bits (=266 bits×8 sets) are written in a memory cell during a period wherein a signal PRG is high.

Thereafter, further detection whether or not there was a burst error during a period wherein a signal BEREAD is high is carried out. When the signal BEREAD is turned to a high state, the data written are read at the DINi in accordance with the order in which the data were output to the DINSi. In this case, the signal DIV is made to be high, while the signal SLINB is made to be low, and they are input to the shift register SL1 as well as the shift register series SL2, . . . , SL10 to thereby calculate syndrome.

In the case where an error exists in read-out data, one or more of members in conditions of the shift registers L1i through L10i become high. Accordingly, when a signal DETE becomes high after finishing the syndrome calculation, a signal ERDETi becomes high. As a result, in the case where the signal ERDETi becomes high with respect to all the i, signal BSTERR transmits the fact to the effect that burst error occurs.

The signal BSTERR is sent to a status register indicating the state of the chip and this information can be transmitted to the outside of the chip by a status read. Since a controller for controlling the chip can recognize an occurring of a fatal error of the memory cell of which an address is accessed, a measure such as no use of the memory cell after occurring an error can be employed.

In general, the data to be input to an error correction/detection circuit may be either of write input data and the inverted data thereof, but in this case, the data are permitted to be the ones which do not tend to code words in the case where burst error occurs. More specifically, when burst error occurs, "1" in the questioned data becomes all "0", i.e., it becomes a so-called full "0", and such full "0" data are judged to be the ones which involve no error, so that the occurrence of burst error cannot be known. In this connection, however, when it is arranged in such that if burst error occurs, "0" in the questioned data becomes all "1", i.e., it tends to be full "1", so that an error is detected, and thus, it becomes possible to know the occurrence of burst error.

Next, operation in reading data will be described hereinbelow.

Read-out is composed of two cycles, i.e., the first cycle wherein syndrome is calculated (a period during a signal ECCREAD is high) and the second cycle for outputting correct data which have been obtained by correcting an error to the outside while correcting such an error (a period during a signal DATAOUT is high). In the first cycle, a signal DIV is high, while a signal SLINB becomes low, so that the data read are output to a DINi and input to shift register series. When completed inputting of the whole data, a signal DETE for detecting error detection is made to be high. At this time, if there are the even number of errors, the signal 2ERDETi informing to that effect becomes high. As a result, all the steps in the first cycle are completed.

Succeedingly, in the second cycle, a signal CORE becomes high, and the correct data which have been obtained by correcting an error are output to the outside while correcting such an error. The data are output in synchronous with a certain clock. At the same time, a state of the shift register series in which the input is allowed to be equal to the output is shifting in synchronous with the clock while maintaining the signal SLINB in a high state. Correction of an error is conducted by inverting such output data in the case where the shift register series are in a specified state. After the correction of an error was conducted, a signal CORRECTi becomes high. However, in spite of the fact that a signal ERDETi informing that an error was detected became high, if the signal CORRECTi is still in a low state, i.e., in the case where no correction was conducted on an error, a signal NOTCORi becomes high.

As described above, in accordance with such a method wherein an error correction/detection circuit is disposed in every respective data input/output buffers, and the input data to be decoded are repeatedly read in two cycles, decoding can be effected without accompanying a delay time as compared with a conventional case, so that a delay circuit can be omitted. The circuit size of an error correction circuit can be reduced in case of particularly long code length.

Moreover, in the present embodiment, as shown in FIGS. 8 and 9, since it is not required to dispose the error correction circuit 11 between the memory cell array 6 and the sense amplifier/data latch circuit 8, the error correction circuit can be disposed in a peripheral region, i.e., in the vicinity of the respective data input/output buffers 12, so that it becomes possible to increase flexibility in the layout thereof.

(Embodiment 4)

FIG. 15 is a block diagram showing the semiconductor memory device according to the fourth embodiment of the present invention, and FIG. 16 is a layout diagram of the same device of FIG. 15. The present embodiment differs from the third embodiment in that an error correction/detection circuit 11 is provided for respective sets of plural data input/output buffers 12 (two in the present embodiment).

In the present embodiment, information data composed of 256 bytes (1 byte=8 bits) are serially input/output through eight data input/output pins IOi (i=1, . . . , 8). From a layout point of view, four data input/output pins (IO1 to IO4) are disposed on the left end of a chip, while four data input/output pins (IO5 to IO8) are disposed on the right end of the chip, respectively. In this case, eight data input/output pins are classified into two sets, i.e., (IO1 to IO4, and IO5 to IO8). The respective data in the respective sets are input/output serially in synchronous with a certain clock. In this respect, 1 byte (=8 bits) is composed of the four bits which are input/output in accordance with a first clock and the four bits which are input/output in accordance with a second clock. According to the same manner as that described above, 1 byte is composed of the four bits which are input/output in accordance with an odd number clock and four bits which are input/output in accordance with an even number clock (FIGS. 17A and 17B).

Thus, the respective sets are composed of information data of 128 bytes=1024 bits. The error correction code used in the present embodiment is Reed-Solomon codes (130, 128) which correct 1 byte error in 130 bytes.

Figure 18A:
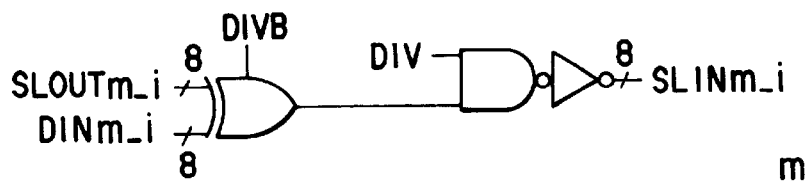
FIGS. 18A through 18R are diagrams each showing the specific circuit structure of an error correction circuit.
Figure 19:
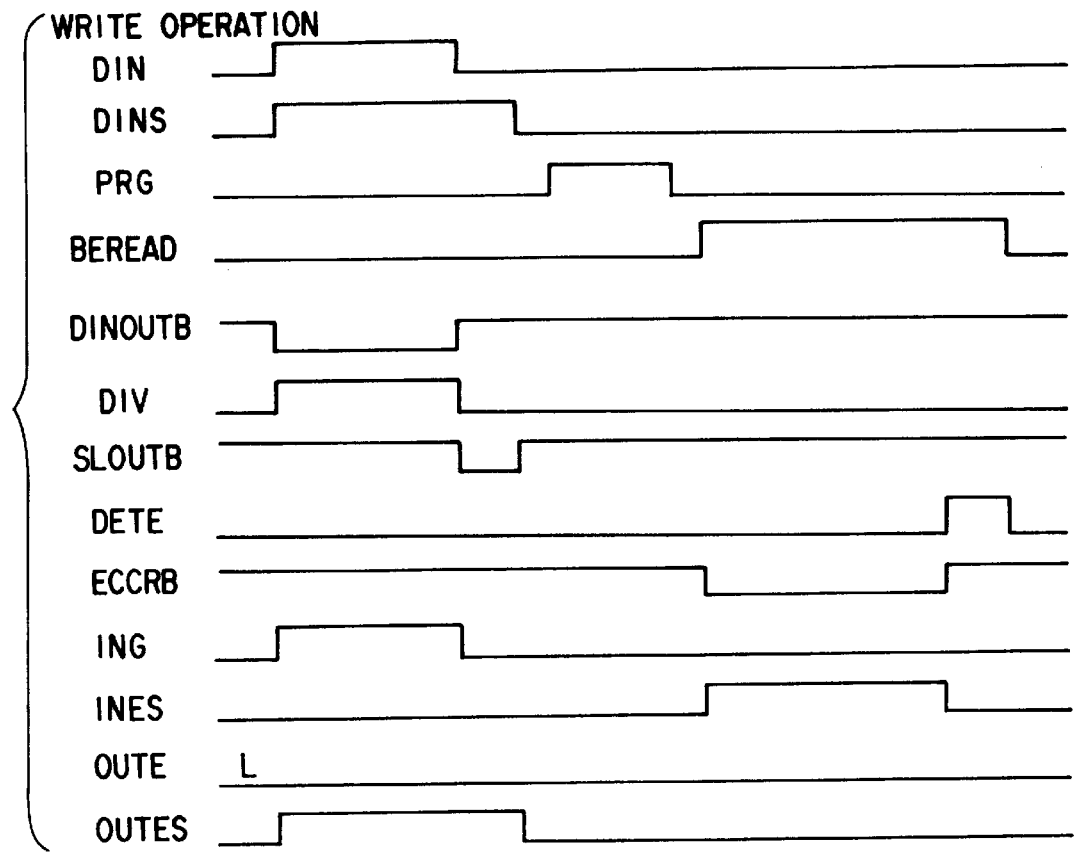
FIG. 19 is a diagram illustrating a timing of control signals at the time of writing in the device according to the fourth embodiment of the present invention.
Figure 20:
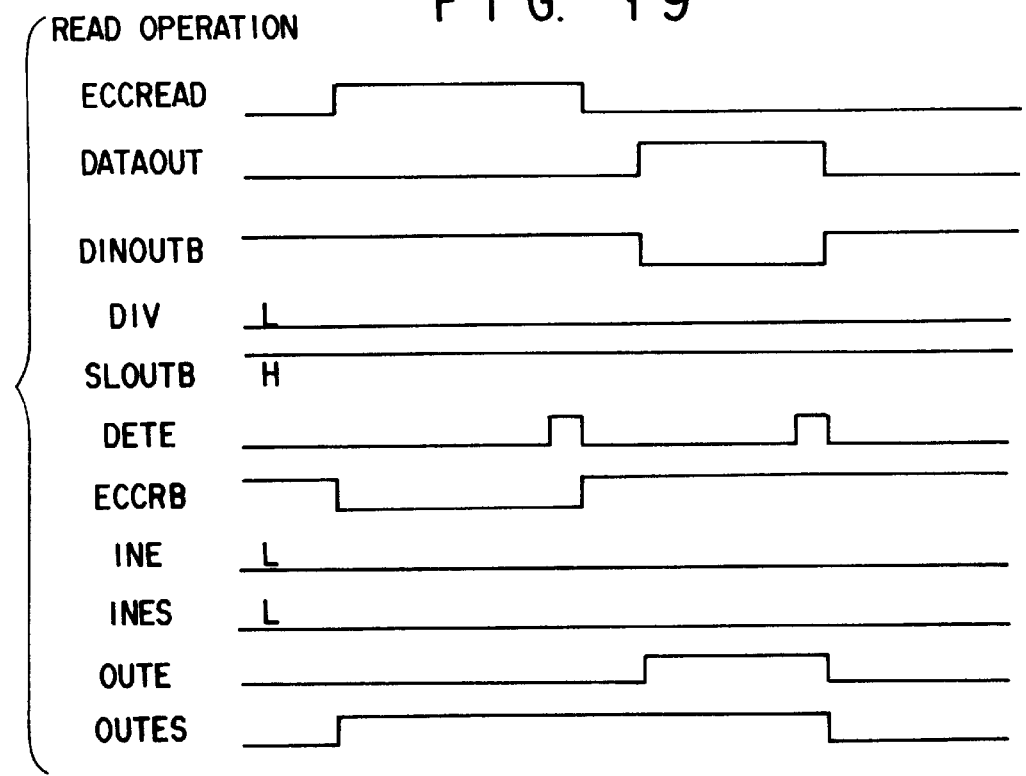
FIG. 20 is a diagram illustrating a timing of control signals at the time of reading in the device according to the fourth embodiment of the present invention.

FIGS. 18A through 18R show specific circuit structures of the error correction circuit used in the present embodiment, respectively, while FIG. 19 and FIG. 20 are diagrams showing timing of control signals in writing operation and in reading operation, respectively.

At first, operation in case of writing data will be described hereinbelow.

Figure 18B:
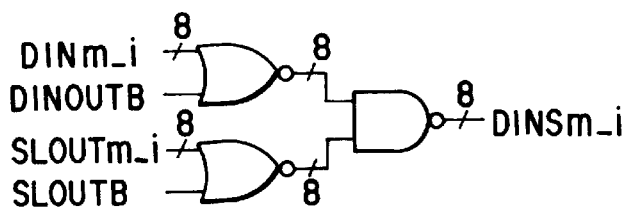
Figure 18C:
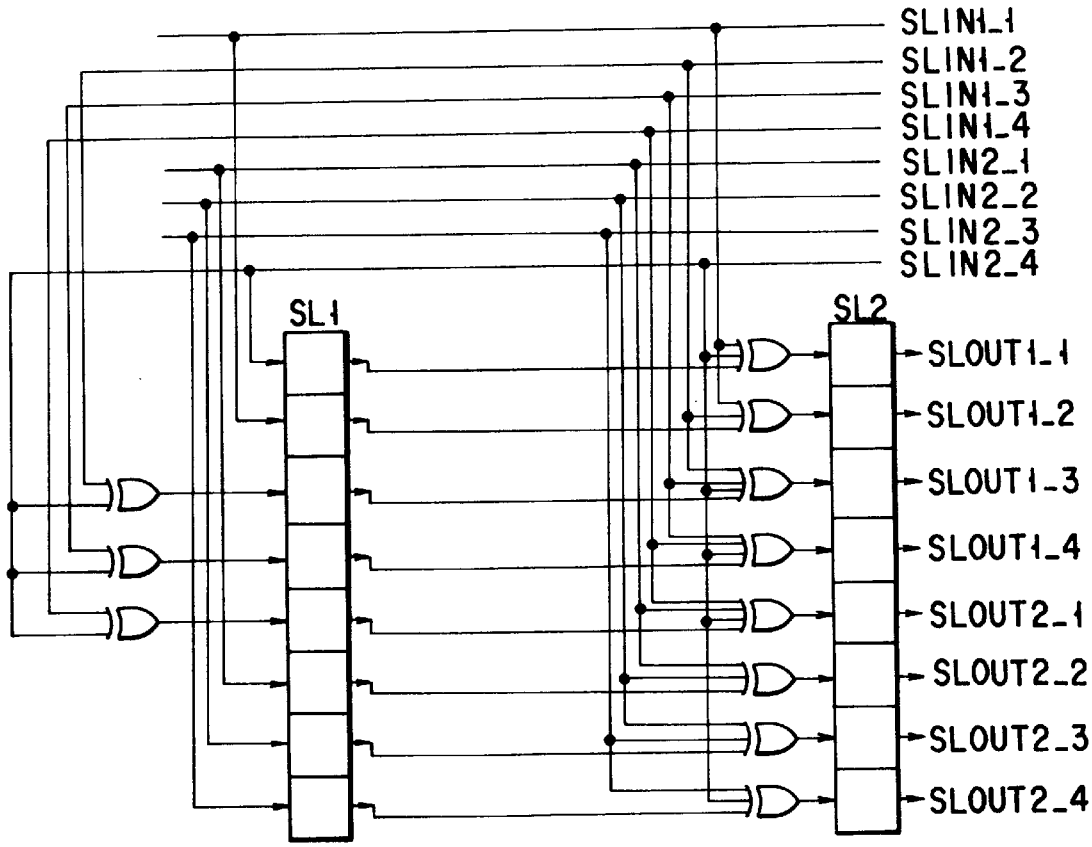
Figure 18D:
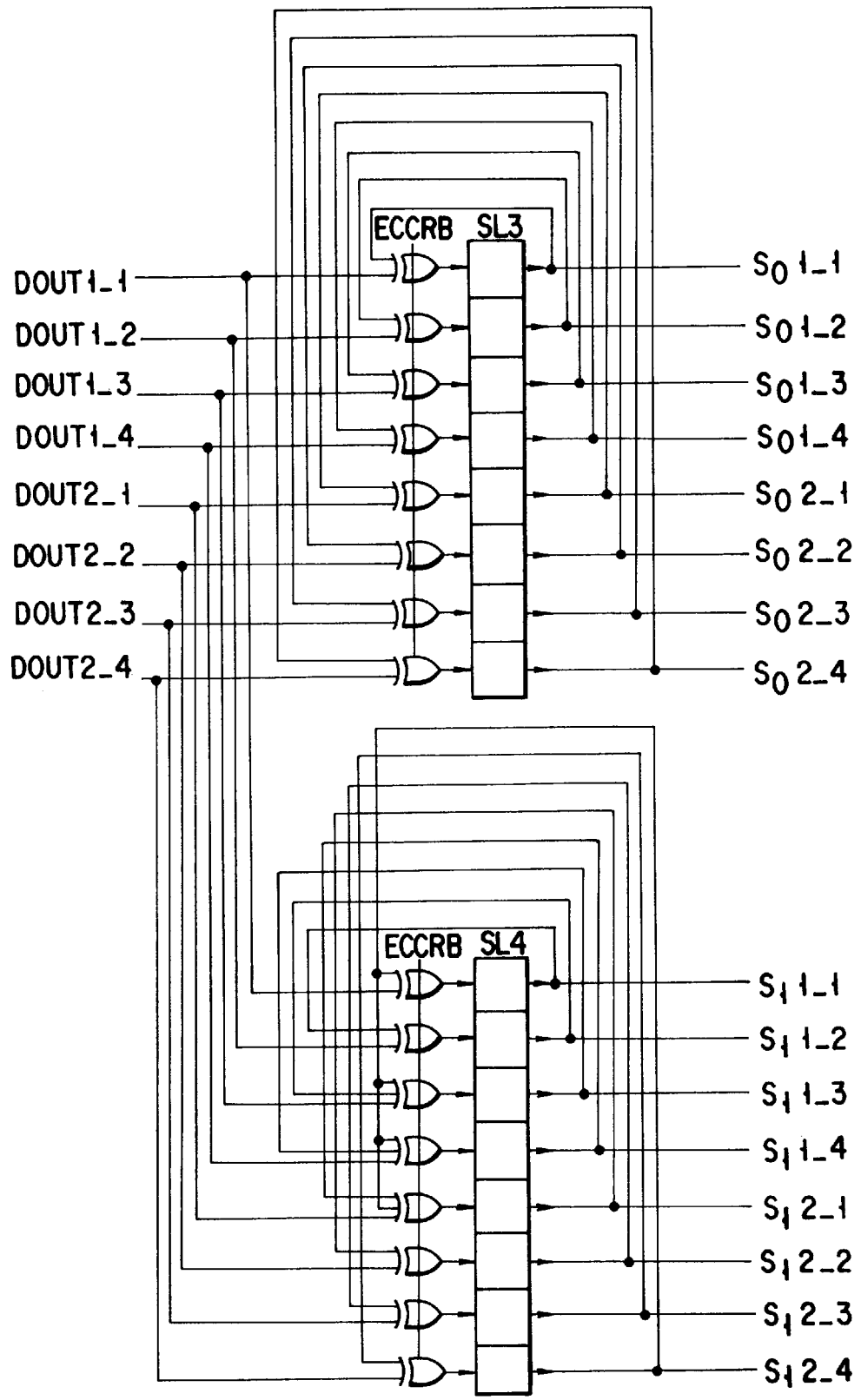
Figure 18E:
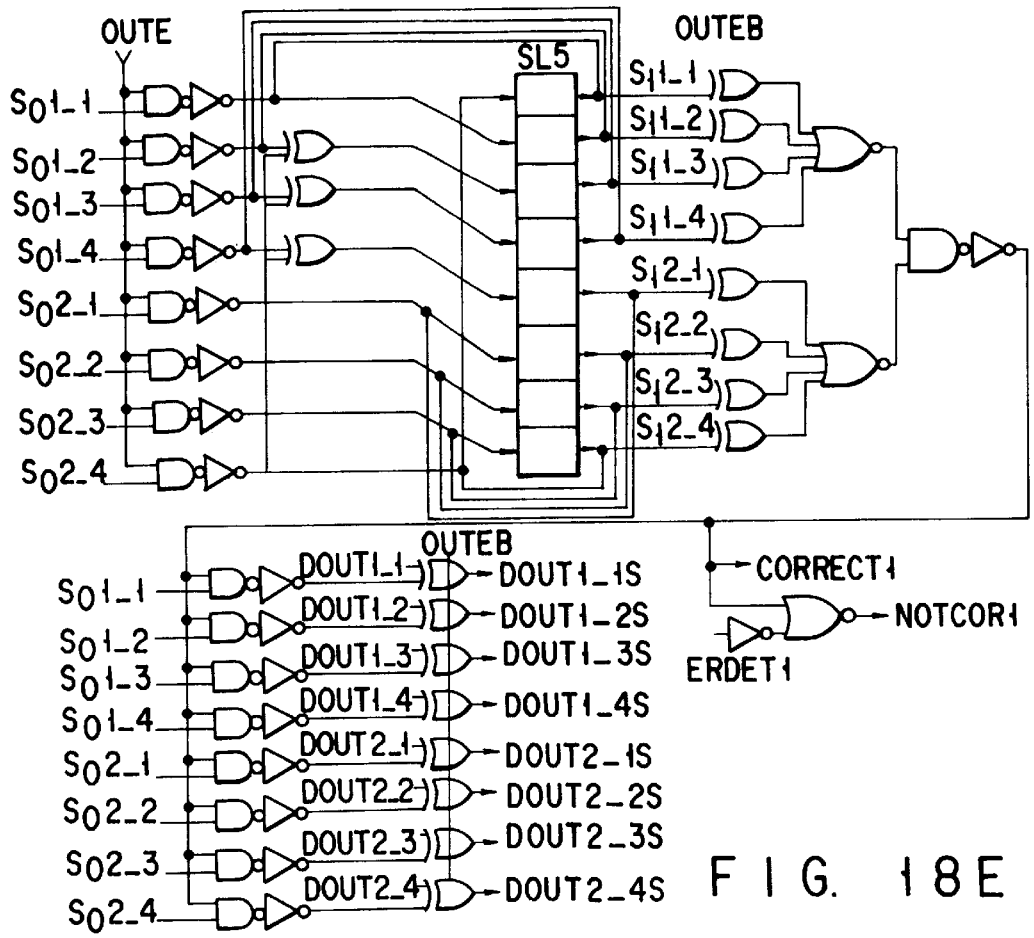
Figure 18F:
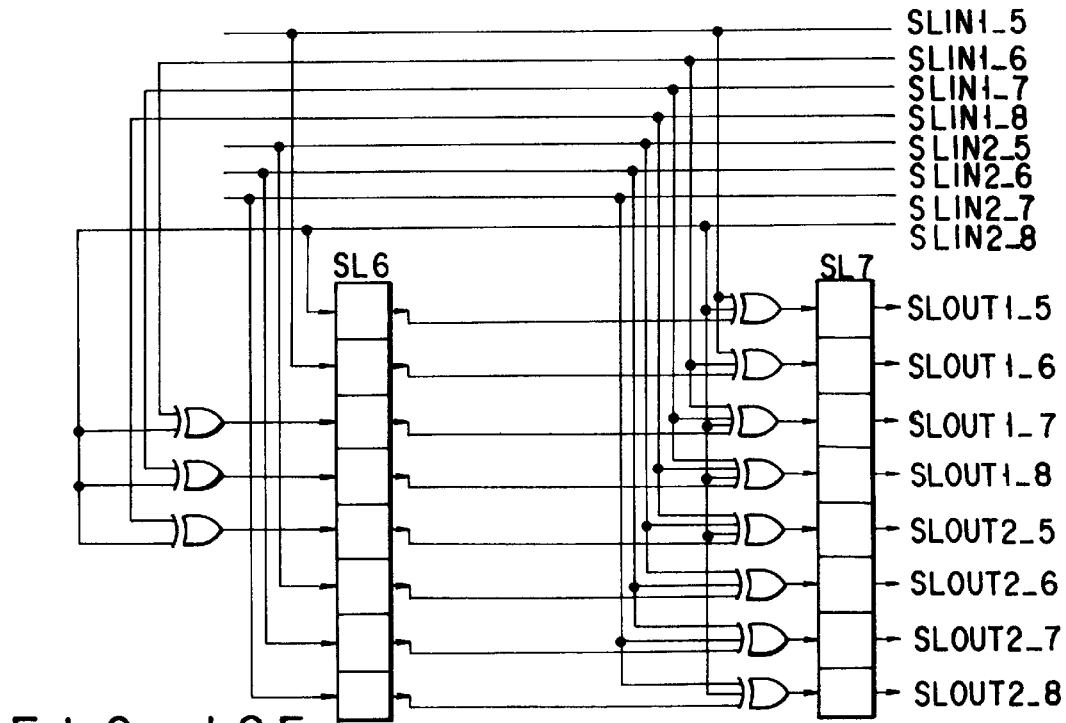
Figure 18G:
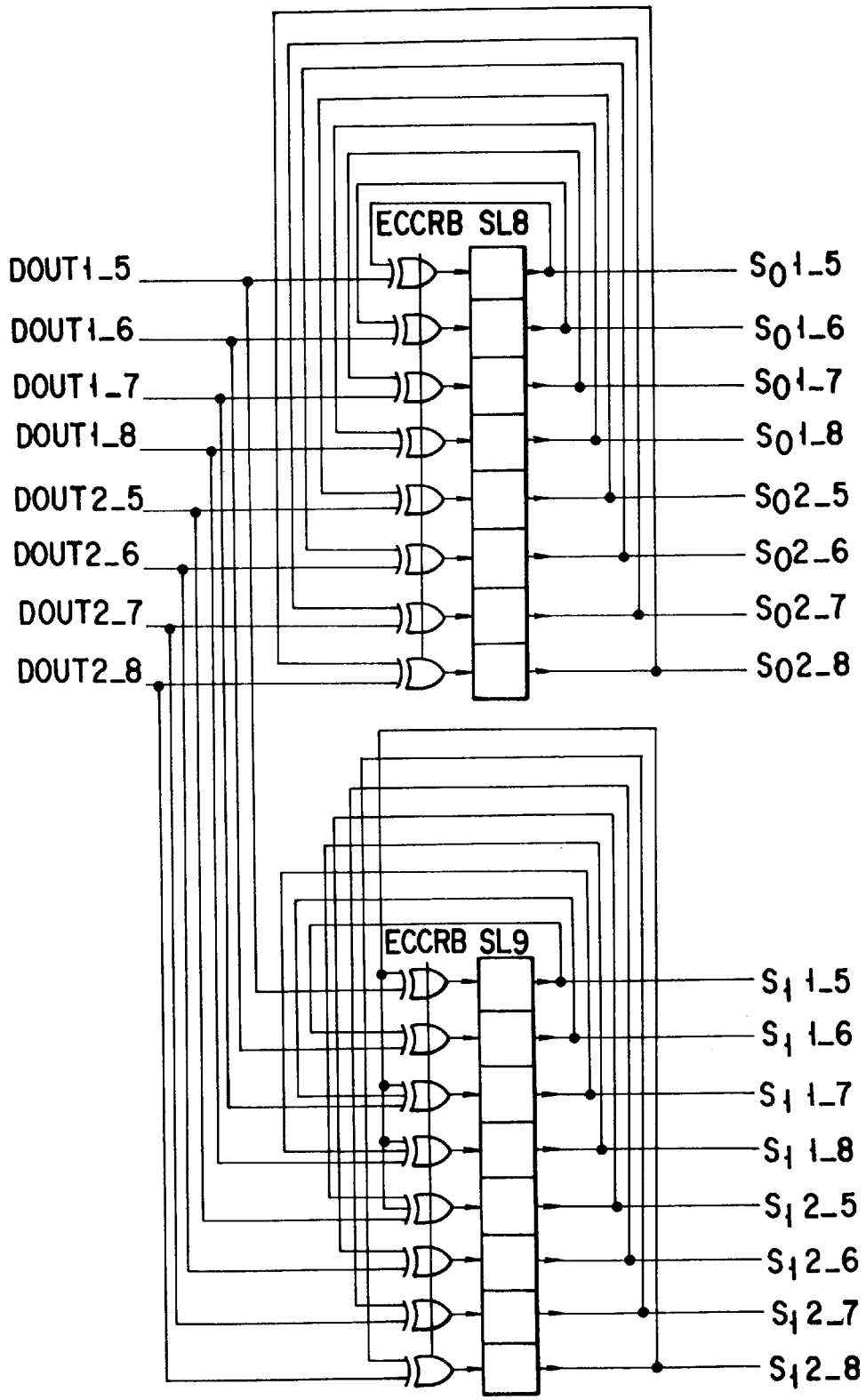
Figure 18H:
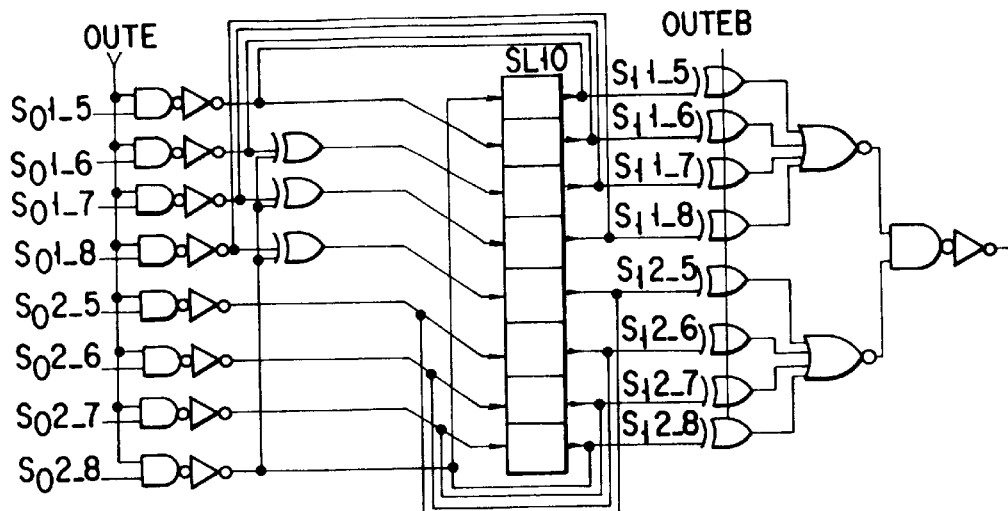
Figure 18H:
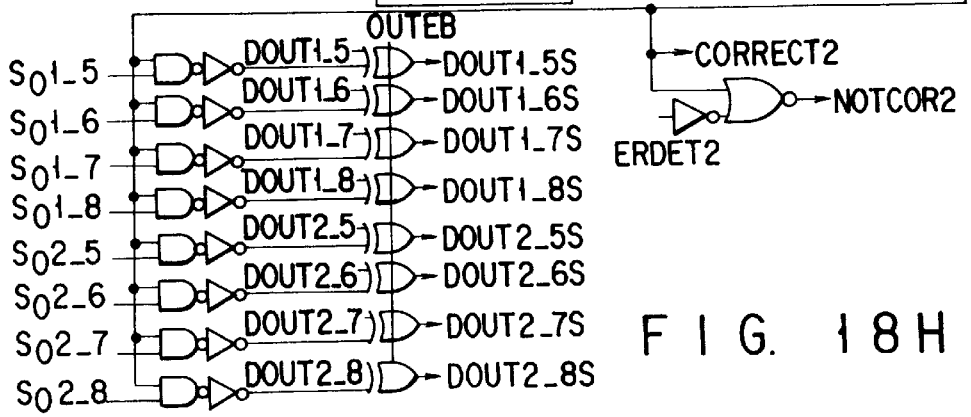
Figure 18I:
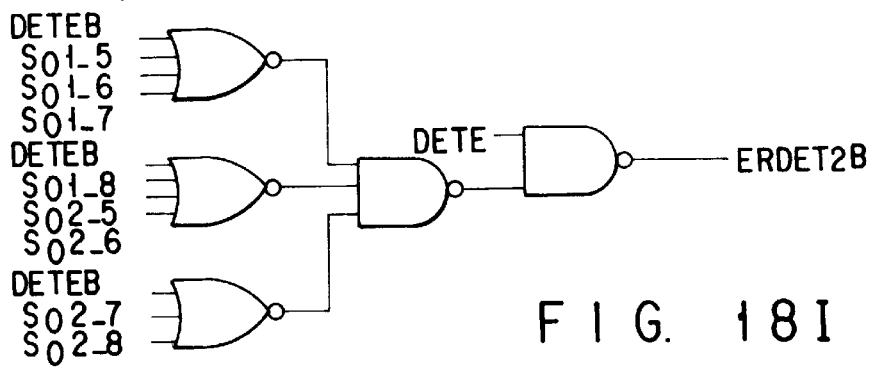
Figure 18J:
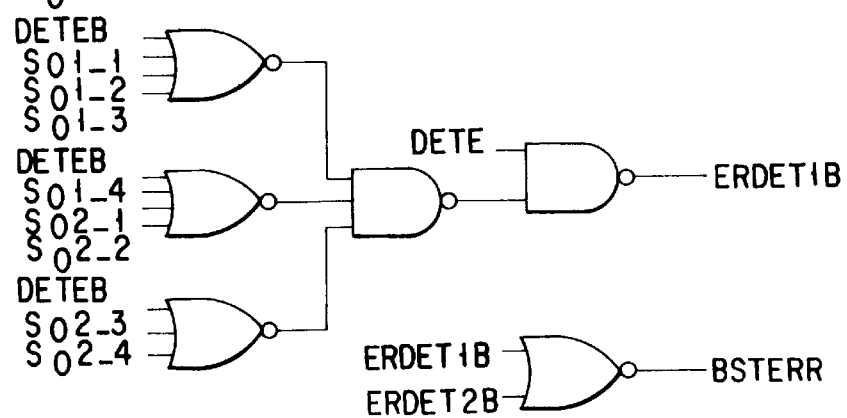

During a period wherein a signal DIN is high, write information data DINm_i (m=1, 2, i=1, . . . , 8) are input from a data input/output pin, and input to the coding circuit shown in FIGS. 18A to 18C. In this case, a signal DINOUTB is made to be low, and DINSm_i=DINm_i is sent to a sense amplifier/data latch circuit 8. At the same time, since a signal DIV is made to be high, the write information data DINm_i are input to a 8 bit shift register SL1, so that calculation for producing check bit is effected. A clock in the shift register is synchronized with that of the input data DINm_i. Since the signal SLOUTB is high, the output SLOUTm_i of a 8 bit shift register SL2 is not output to the DINSm_i.

When completed inputting of the write information data DINm_i, the signal DINOUTB turns to high, the signal DIV turns to low, and the signal SLOUTB turns to low, so that when the input SLINm_i is fixed to low, the conditions of the 8 bit shift registers SL 1 and 2 are output to the DINSm_i. Thereafter, when the signal DINS becomes low and the signal SLOUTB becomes high, inputting of write data is completed.

As a consequence, the write data which are input to the sense amplifier/data latch circuit 8 come to be two coded words composed of 128 bytes of information data and 2 bytes of check data.

Then, the resulting write data are written in a memory cell during a period wherein a signal PRG is high.

Thereafter, further detection of whether or not there was burst error during a period wherein a signal BEREAD is in a high state is conducted. When the signal BEREAD becomes high, the written data are read at a DOUTm_i in accordance with the order wherein the data were output to the DINSm_i. In this case, a signal CCRB is made to be low, and input to shift registers SL3 and SL4 to thereby calculate syndrome. In the case where write data involve an error, one or more member in $S_o$ m_i become high. Accordingly, after completing the syndrome calculation, when a signal DETE becomes high, signals ERDETmB become also high. When both the signals ERDETmB tend to low with respect to m=1, 2, a signal BSTERR transmits the fact to the effect that burst error occurs.

The signal BSTERR is sent to a status register indicating the state of the chip and this information can be transmitted to the outside of the chip by a status read. Since a controller for controlling the chip can recognize an occurring of a fatal error of the memory cell of which an address is accessed, a measure such as no use of the memory cell after occurring an error can be employed.

In general, the data to be input to an error correction/detection circuit may be either of write input data and the inverted data thereof, but in this case, the data are permitted to be the ones which do not tend to coded words in the case where burst error occurs. More specifically, when burst error occurs, "1" in the questioned data becomes all "0", i.e., once all the members turned to the aforesaid "0", such full "0" data are judged to be the ones which involve no error, so that the occurrence of burst error cannot be known. In this connection, however, when it is arranged in such that if burst error occurs, "0" in the questioned data becomes all "1", i.e., it tends to be full "1", so that an error is detected, and thus, it becomes possible to know the occurrence of burst error.

Next, operation in case of reading data will be described hereinbelow.

Read-out is composed of two cycles, i.e., the first cycle wherein syndrome is calculated (a period during a signal ECCREAD is high) and the second cycle for outputting correct data which have been obtained by correcting an error to the outside while correcting such an error (a period during a signal DATAOUT is high). In the first cycle, a signal ECCRB is low, while the data read are output to the DOUTm_i and input to 8 bit shift registers SL3, SL4, SL8, and SL9. When completed inputting of the whole data, the signal DETE for detecting error detection is made to be high. At this time, if there is an error, at least one of the conditions of the shift registers becomes high, so that a signal ERDETmB informing to the fact that an error was detected becomes low. As a result, all the steps in the first cycle are completed.

Succeedingly, in the second cycle, a signal OUTEB becomes low, and the correct data which have been obtained by correcting an error are output to the outside while correcting such an error. The data are output in synchronous with a prescribed clock. At the same time, the outputs of the 8 bit shift registers SL5 and SL10 in which the input is low shift in synchronous with the clock and fed back. Correction of an error is conducted by inverting such data which are output in the case when the outputs of the 8 bit shift registers SL5 and SL10 coincide with the syndrome Sm_i. After the correction of an error was conducted, a signal CORRECTi becomes high. However, in spite of the fact that a signal ERDETi informing that an error was detected became high, if the signal CORRECTi is still in a low state, i.e., in the case where no correction was conducted on an error, a signal NOTCORi becomes high.

As described above, in accordance with such a method wherein an error correction/detection circuit is disposed in every set of data input/output buffers, and the input data to be decoded are repeatedly read in two cycles, decoding can be effected without accompanying a delay time, so that a delay circuit can be omitted. The circuit size of an error correction circuit can be reduced in case of particularly long code length in the present invention.

Furthermore, when a bit number per byte is extended from four bits to eight bits, the maximum code length can be extended.

Moreover, in the present embodiment, as shown in FIGS. 10A and 10B, since it is not required to dispose the error correction circuit 11 between the memory cell array 6 and the sense amplifier/data latch circuit 8, the error correction circuit can be disposed in a peripheral region, i.e., in the vicinity of the respective data input/output buffers 12, so that it becomes possible to increase flexibility in the layout point of view.

It will be appreciated by those of ordinary skill in the art that the present invention can be embodied in other specific forms without departing from the spirit or essential characteristics thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An error correction/detection circuit comprising:
   a syndrome generating circuit for generating a syndrome from information data and check data input in a first cycle;
   an error position/size calculating circuit for calculating a position and a size of an error from said syndrome; and
   an error correction circuit for correcting an error for at least information data input in a second cycle on a basis of the position and the size of the error obtained in said error position/size calculating circuit and for outputting at least error-corrected information data.

2. An error correction/detection circuit according to claim 1, further comprising:
   a first switch which is connected to an input side of said syndrome generating circuit and which is turned ON in said first cycle, and turned OFF in said second cycle; and
   a second switch which is connected to an input side of said error correction circuit and which is turned OFF in said first cycle, and turned ON in said second cycle.

3. An error correction/detection circuit comprising:
   a code length extension circuit for converting information data wherein 1 byte is b bits into information data wherein 1 byte is mb bits (m is a natural number being 2 or more);
   a check data generating circuit for generating check data for correcting single byte error or plural bytes error composed of mb bits from the output of said code length extension circuit; and
   single byte error or plural bytes error correction circuit for correcting single byte error or plural bytes error composed of mb bits on the basis of said information data and said check data.

4. An error correction/detection circuit according to claim 3, wherein said byte error correction circuit outputs successively information of b bits bytes after correcting single byte error or plural bytes error composed of mb bits.

5. An error correction/detection circuit comprising:
   a plurality of error detection circuits for detecting errors of data which are made into blocks; and
   means for outputting a burst error detection signal in the case when errors were detected in all the said error detection circuits.

6. A semiconductor memory device comprising:
   a memory cell array having a plurality of memory cells;
   N data output buffers for outputting data with respect to said plurality of memory cells, said N data output buffers divided into n ($1 \leq n < N$) data output buffer groups each of which includes at least one data output buffer; and
   error correction/detection circuits each of which is provided for corresponding of said data output buffer groups and which corrects/detects at least one error of data read out from said memory cells;
   wherein data is configured into blocks, and each of said error correction/detection circuit further comprises an error detection circuit provided for each of said blocks, and said error detection circuit detects an error in a corresponding block, and said memory device further comprising:
   means for outputting a burst error detection signal when at least two error detection circuits of said correction/detection circuits detect errors.

7. A semiconductor memory device according to claim 6, wherein each of said error correction/detection circuits further comprises:
   a syndrome generating circuit for generating a syndrome from information data and check data input in a first cycle;
   an error position/size calculating circuit for calculating a position and a size of an error from said syndrome; and
   an error correction circuit for correcting an error for at least information data input in a second cycle on a basis of the position and the size of the error obtained in said error position/size calculating circuit and for outputting at least error-corrected information data.

8. A semiconductor memory device according to claim 6, wherein each of said error correction/detection circuits is located next to each of said data output buffers or next to M (1<M<N) data output buffers located nearby one another.

9. A semiconductor memory device according to claim 6, wherein each of said error correction/detection circuits corrects/detects an error of data to be output from each of said data output buffers or from M (1<M<N) of said data output buffers.

10. A semiconductor memory device comprising:
a memory cell array having a plurality of electrically programmable memory cells;
N data input/output buffers for inputting data to be programmed into said plurality of memory cells as well as for outputting data read out from said plurality of memory cells, said N data input/output buffers divided into n (1≦n<N) data input/output buffer groups each of which includes at least one data input/output buffer; and
error correction/detection circuits, each of which is provided for corresponding of said data input/output buffer groups, for generating check data for correcting/detecting an error from said input data, for generating a syndrome from said read data and said check data, and correcting/detecting an error in said read data on a basis of said read data, said check data and said syndrome when outputting said read data;
wherein each of said error correction/detection circuits comprises:
a code length extension circuit for converting information data, wherein 1 byte is composed of b bits, into converted information data, wherein 1 byte is composed of mb bits (m≧2);
a check data generating circuit for generating check data, wherein 1 byte is composed of mb bits, from the output of said code length extension circuit; and
single byte error or plural bytes error correction circuit for correcting an error of a single byte or errors of plural bytes, wherein 1 byte is composed of mb bits, on a basis of said information data and said check data.

11. A semiconductor memory device according to claim 10, wherein said error correction/detection circuits detect said error at a position where a burst error can be detected during the programming of data.

12. A semiconductor memory device according to claim 10, wherein data are configured into blocks, and each of said error correction/detection circuits comprises an error detection circuit provided for each of said blocks, and said error detection circuit detects an error in a corresponding block, said memory device further comprising:
means for outputting a burst error detection signal when at least two error detection circuits of said correction/detection circuits detect errors.

13. A semiconductor memory device according to claim 10, wherein each of said error correction/detection circuits is located next to each of said data output buffers or next to M (1<M<N) data output buffers located nearby one another.

14. A semiconductor memory device according to claim 13, wherein each of said error correction/detection circuits detects said error at a position where a burst error can be detected during the programming of data.

15. A semiconductor memory device according to claim 10, wherein said error correction/detection circuits are disposed in the vicinity of said data output buffers.

16. A semiconductor memory device according to claim 15, wherein each of said error correction/detection circuits detect said error at a position where a burst error can be detected during the programming of data.

17. A semiconductor memory device comprising:
a memory cell array having a plurality of memory cells;
a sense amplifier/data latch circuit for sensing and for temporarily storing data of said plurality of memory cells during a read operation; and
an error correction/detection circuit which comprises:
a syndrome generating circuit for generating a syndrome from information data and check data input in a first cycle;
an error position/size calculating circuit for calculating a position and a size of an error from said syndrome; and
an error correction circuit for correcting an error for at least information data input in a second cycle on a basis of the position and the size of the error obtained in said error position/size calculating circuit and for outputting at least error-corrected information data;
wherein data latched in said sense amplifier/data latch circuit are transferred to said error correction/detection circuit twice.

18. An error correction/detection circuit comprising:
a syndrome generating circuit for generating a syndrome from information data and check data serially input in a first cycle;
an error position/size calculating circuit for calculating a position and a size of an error from said syndrome; and
an error correction circuit for correcting an error for at least information data serially input in a second cycle on a basis of the position and the size of the error obtained in said error position/size calculating circuit and for serially outputting at least error-corrected information data.

19. An error correction/detection circuit according to claim 18, further comprising:
a first switch which is connected to an input side of said syndrome generating circuit and which is turned ON in said first cycle, and turned OFF in said second cycle; and
a second switch which is connected to an input side of said error correction circuit and which is turned OFF in said first cycle, and turned ON in said second cycle.

20. A semiconductor memory device comprising:
a memory cell array having a plurality of memory cells; and
N data output buffers for serially outputting data with respect to said plurality of memory cells, said N data output buffers divided into n (1≦n<N) data output buffer groups each of which includes at least one data output buffer; and
error correction/detection circuits each of which is provided for corresponding of said data output buffer groups and which corrects/detects at least one error of data read out from said plurality of memory cells;
wherein data are configured into blocks, and each of said error correction/detection circuits comprises an error detection circuit provided for each of said blocks, and said error detection circuit detects an error in a corresponding block, said memory device further comprising:
means for outputting a burst error detection signal when at least two error detection circuits of said error correction/detection circuits detect errors.

21. A semiconductor memory device according to claim 20, wherein each of said error correction/detection circuits comprises:

a syndrome generating circuit for generating a syndrome from information data and check data serially input in a first cycle;

an error position/size calculating circuit for calculating a position and a size of an error from said syndrome; and an error correction circuit for correcting an error for at least information data serially input in a second cycle on a basis of the position and the size of the error obtained in said error position/size calculating circuit and for serially outputting at least error-corrected information data.

22. A semiconductor memory device according to claim 20, wherein each of said error correction/detection circuits is located next to each of said N data output buffers or next to M (1<M<N) of said N data output buffers located nearby one another.

23. A semiconductor memory device according to claim 20, wherein each of said error correction/detection circuits corrects/detects an error of data to be serially output from each of said N data output buffers or from M (1<M<N) of said N data output buffers.

24. A semiconductor memory device comprising:

a memory cell array having a plurality of electrically programmable memory cells;

N data input/output buffers for serially inputting data to be programmed into said memory cells and for serially outputting data read out from said plurality of memory cells, said N data input/output buffers divided into n (1≦n<N) data input/output buffer groups each of which includes at least one data input/output buffer; and error correction/detection circuits, each of which is provided for corresponding of said data input/output buffer groups, for generating check data for correcting/detecting an error from said data serially input, for generating a syndrome from said read data and said check data, and for correcting/detecting an error in said read data on a basis of said read data, said check data and said syndrome when serially outputting said read data;

wherein each of said error correction/detection circuits further comprises:

a code length extension circuit for converting information data, wherein 1 byte is composed of b bits, into converted information data, wherein 1 byte is composed of mb bits (m≧2);

a check data generating circuit for generating a check data, wherein 1 byte is composed of mb bits, from the output of said code length extension circuit; and single byte error or plural bytes error correction circuit for correcting an error of a single byte or errors of plural bytes, wherein 1 byte is composed of mb bits, on a basis of said information data and said check data.

25. A semiconductor memory device according to claim 24, wherein said error correction/detection circuits detect said error at a position where a burst error can be detected during programming of data.

26. A semiconductor memory device according to claim 24, wherein data are configured into blocks, each of said error correction/detection circuits comprises an error detection circuit provided for each of said blocks, and said error detection circuit detects an error in a corresponding block, said memory device further comprising:

means for outputting a burst error detection signal when at least two error detection circuits of said error correction/detection circuits detect errors.

27. A semiconductor memory device according to claim 24, wherein each of said error correction/detection circuits is located next to each of said N data input/output buffers or next to M (1<M<N) of said N data input/output buffers located nearby one another.

28. A semiconductor memory device according to claim 27, wherein each of said error correction/detection circuits detects said error at a position where a burst error can be detected during programming of data.

29. A semiconductor memory device according to claim 24, wherein each of said error correction/detection circuits provided for said n of said N data input/output buffers corrects/detects an error of data to be serially output from each of said N data input/output buffers or from M (1<M<N) of said N data input/output buffers.

30. A semiconductor memory device according to claim 29, wherein each of said error correction/detection circuits detects said error at a position where a burst error can be detected during programming of data.

31. A semiconductor memory device comprising:

a memory cell array having a plurality of memory cells;

a sense amplifier/data latch circuit for sensing and for temporarily storing data of said plurality of memory cells during read operation; and an error correction/detection circuit comprising:

a syndrome generating circuit for generating a syndrome from information data and check data serially input in a first cycle;

an error position/size calculating circuit for calculating a position and a size of an error from said syndrome; and an error correction circuit for correcting an error for at least information data serially input in a second cycle on a basis of the position and the size of the error obtained in said error position/size calculating circuit and for serially outputting at least error-corrected information data;

wherein data latched in said sense amplifier/data latch circuit are transferred to said error correction/detection circuit twice.

* * * * *